United States Patent
Ratner et al.

(10) Patent No.: US 11,521,309 B2
(45) Date of Patent: Dec. 6, 2022

(54) METHOD AND APPARATUS FOR RAPID INSPECTION OF SUBCOMPONENTS OF MANUFACTURED COMPONENT

(71) Applicant: Bruker Nano, Inc., Santa Barbara, CA (US)

(72) Inventors: Edward R. Ratner, Minneapolis, MN (US); Renjie Hu, San Jose, CA (US)

(73) Assignee: Bruker Nano, Inc., Santa Barbara, CA (US)

( * ) Notice: Subject to any disclaimer, the term of this patent is extended or adjusted under 35 U.S.C. 154(b) by 0 days.

(21) Appl. No.: 16/874,248

(22) Filed: May 14, 2020

(65) Prior Publication Data

US 2020/0380664 A1    Dec. 3, 2020

Related U.S. Application Data

(60) Provisional application No. 62/854,769, filed on May 30, 2019.

(51) Int. Cl.
*G06T 7/00*       (2017.01)
*G01N 21/95*       (2006.01)
(Continued)

(52) U.S. Cl.
CPC ....... *G06T 7/0004* (2013.01); *G01N 21/9501* (2013.01); *G01N 21/95607* (2013.01);
(Continued)

(58) Field of Classification Search
CPC ....... G01N 2021/8883; G01N 21/9501; G01N 21/95607; G01N 21/95684;
(Continued)

(56) References Cited

U.S. PATENT DOCUMENTS 5,896,294 A    4/1999   Chow et al.
6,016,201 A    1/2000   Lin et al.
(Continued)

OTHER PUBLICATIONS

Internal Search Report and Written Opinion of the International Searching Authority for Application No. PCT/US2020/033586, dated Aug. 28, 2020 [dated Aug. 28, 2020], 8 sheets.

*Primary Examiner* — Bobbak Safaipour
(74) *Attorney, Agent, or Firm* — Boyle Fredrickson S.C.

(57) ABSTRACT

The presently-disclosed technology enables real-time inspection of a multitude of subcomponents of a component in parallel. For example, the component may be a semiconductor package, and the subcomponents may include through-silicon vias. One embodiment relates to a method for inspecting multiple subcomponents of a component for defects, the method comprising, for each subcomponent undergoing defect detection: extracting a subcomponent image from image data of the component; computing a transformed feature vector from the subcomponent image; computing pairwise distances from the transformed feature vector to each transformed feature vector in a training set; determining a proximity metric using said pairwise distances; and comparing the proximity metric against a proximity threshold to detect a defect in the subcomponent. Another embodiment relates to a product manufactured using a disclosed method of inspecting multiple subcomponents of a component for defects. Other embodiments, aspects and features are also disclosed.

19 Claims, 20 Drawing Sheets

(51) Int. Cl.
  *G01N 21/956* (2006.01)
  *G06T 7/11* (2017.01)
  *G06T 7/73* (2017.01)

(52) U.S. Cl.
  CPC ............... *G06T 7/11* (2017.01); *G06T 7/73* (2017.01); *G06T 2207/10116* (2013.01); *G06T 2207/20021* (2013.01); *G06T 2207/20081* (2013.01); *G06T 2207/30148* (2013.01)

(58) Field of Classification Search
  CPC .... G05B 19/41875; G05B 2219/37224; G06T 2207/10116; G06T 2207/20021; G06T 2207/20081; G06T 2207/30148; G06T 7/0004; G06T 7/11; G06T 7/73; H01L 22/12; H01L 22/20
  See application file for complete search history.

(56) References Cited

U.S. PATENT DOCUMENTS

| | | |
|---|---|---|
| 6,703,623 B1 | 3/2004 | Shimazu et al. |
| 7,079,235 B2 | 7/2006 | Lehman |
| 7,743,660 B2 | 6/2010 | Marsh et al. |
| 10,346,962 B2 | 7/2019 | Stephens, II et al. |
| 10,346,969 B1 | 7/2019 | Raghu et al. |
| 10,599,951 B2 | 3/2020 | Bhaskar et al. |
| 10,632,023 B2 | 4/2020 | Kawka et al. |
| 10,657,635 B2 | 5/2020 | Kaneko |
| 2010/0204942 A1 | 8/2010 | Danielsson et al. |
| 2011/0306359 A1 | 12/2011 | Alizadeh-Shabdiz et al. |
| 2014/0064445 A1* | 3/2014 | Adler .................. G01N 23/083 378/43 |
| 2016/0163035 A1 | 6/2016 | Chang et al. |
| 2016/0313651 A1 | 10/2016 | Middlebrooks et al. |
| 2018/0096979 A1 | 4/2018 | Pappu et al. |
| 2018/0209924 A1* | 7/2018 | Sasazawa ............. G01N 23/18 |
| 2018/0226307 A1 | 8/2018 | Pagani et al. |
| 2019/0096135 A1 | 3/2019 | Dal Mutto et al. |
| 2019/0197679 A1 | 6/2019 | Fang et al. |
| 2020/0020094 A1 | 1/2020 | Chang et al. |
| 2020/0284883 A1* | 9/2020 | Ferreira ................ G01S 7/4817 |
| 2020/0380654 A1* | 12/2020 | Ratner .................... G06T 7/001 |
| 2021/0010954 A1* | 1/2021 | Adler .................... G06T 7/0012 |
| 2021/0012499 A1* | 1/2021 | Adler .................... G06T 7/0014 |

\* cited by examiner

|      | Fa      | Fb      | Fc       | Fd       | Fe      | Ff      | Fg       | Fh      |
|------|---------|---------|----------|----------|---------|---------|----------|---------|
| FV1  | 652.954 | 646.104 | 0.849963 | 0.995081 | 1.20031 | 0.59762 | 0.782964 | 1.11352 |
| FV2  | 622.194 | 609.014 | 0.846112 | 0.989687 | 1.19273 | 0.60133 | 0.793419 | 1.12755 |
| FV3  | 569.584 | 548.416 | 0.839208 | 0.979015 | 1.17673 | 0.60521 | 0.800575 | 1.14584 |
| FV4  | 634.528 | 627.59  | 0.84939  | 0.993858 | 1.19817 | 0.60861 | 0.8039   | 1.14328 |
| FV5  | 689.796 | 676.769 | 0.846168 | 0.988976 | 1.19094 | 0.60703 | 0.800299 | 1.14287 |
| FV6  | 536.217 | 529.705 | 0.848975 | 0.993295 | 1.19739 | 0.60663 | 0.798103 | -1.1381 |
| FV7  | 557.906 | 554.862 | 0.851192 | 0.99624  | 1.20137 | 0.60747 | 0.798663 | 1.13837 |
| FV8  | 572.061 | 589.272 | 0.863756 | 1.01431  | 1.22721 | 0.60999 | 0.796894 | 1.13091 |
| FV9  | 685.184 | 689.113 | 0.855546 | 1.0028   | 1.21104 | -0.6117 | 0.803064 | 1.14346 |
| FV10 | 640.681 | 625.409 | 0.844447 | 0.986649 | 1.18775 | 0.60045 | 0.790518 | 1.12791 |
| FV11 | 592.977 | 597.746 | 0.856397 | 1.00404  | 1.21285 | 0.61609 | 0.809624 | 1.15345 |
| FV12 | 685.572 | 701.39  | 0.861683 | 1.01165  | 1.22374 | 0.61031 | 0.798003 | 1.13314 |
| FV13 | 731.123 | 729.919 | 0.852676 | 0.998465 | 1.20464 | 0.60478 | 0.793643 | 1.12979 |
| FV14 | 574.007 | 574.569 | 0.85366  | 0.99991  | 1.20674 | 0.59634 | 0.78276  | -1.1086 |
| FV15 | 676.038 | 688.55  | 0.859623 | 1.00823  | 1.21839 | 0.61067 | 0.802778 | 1.13809 |
| FV16 | 656.32  | 663.538 | 0.857386 | 1.00541  | 1.21474 | 0.59622 | 0.780698 | 1.10389 |
| FV17 | 743.531 | 745.343 | 0.854486 | 1.00139  | 1.20915 | 0.60293 | 0.789527 | 1.12235 |
| FV18 | 626.954 | 637.188 | 0.859261 | 1.0081   | 1.21859 | 0.60655 | 0.79321  | 1.12656 |
| FV19 | 623.374 | 637.733 | 0.861474 | 1.01116  | 1.22285 | 0.60656 | 0.792362 | 1.12448 |
| FV20 | 96.403  | 93.9165 | 0.843715 | 0.98561  | 1.18628 | 0.61274 | 0.813099 | 1.15986 |
| FV21 | 681.411 | 689.285 | 0.857658 | 1.00587  | 1.21548 | 0.60425 | 0.790224 | 1.12237 |
| FV22 | 616.636 | 635.056 | 0.864277 | 1.01563  | 1.22968 | 0.61077 | 0.797269 | 1.13082 |
| FV23 | 634.497 | 642.867 | 0.858475 | 1.00728  | 1.21772 | 0.60223 | 0.789315 | 1.11678 |

Illustrative Example Showing Eight (Fa, Fb, ..., Fh) of 21 Features for 23 Feature Vectors (FV1, FV2, ..., FV23) in Training Set

FIG. 7A

|  | Fa | Fb | Fc | Fd | Fe | Ff | Fg | Fh |
|---|---|---|---|---|---|---|---|---|
| Mean | 613.041 | 614.494 | 0.853719 | 1.00012 | 1.20715 | -0.60593 | 0.795692 | -1.13139 |
| Std Dev | 122.096 | 123.913 | 0.006717 | 0.009692 | 0.01391 | 0.005153 | 0.007949 | 0.013386 |

Illustrative Example Showing Mean and Standard Deviation of Eight (Fa, Fb, ..., Fh) of 21 Features for 23 Feature Vectors in Training Set

FIG. 7B

| | | | | | | | | |
|---|---|---|---|---|---|---|---|---|
| 8.97966 | 4.12669 | 2.91958 | 2.11297 | 1.00224 | 0.670182 | 0.507611 | 0.323976 | 0.192526 |
| 0.083941 | 0.04861 | 0.020444 | 0.01191 | 0.004252 | 0.000945 | 0.000289 | 0.000105 | 1.28E-05 |
| 3.21E-06 | 7.89E-07 | 8.05E-08 | | | | | | |

Illustrative Example Showing 21 Eigenvalues of the Transformation to an Eigenspace

FIG. 7D

|      | Fa       | Fb       | Fc       | Fd       | Fe       | Ff       | Fg       | Fh       |
|------|----------|----------|----------|----------|----------|----------|----------|----------|
| FV1  | 0.326899 | 0.255103 | -0.55913 | -0.5195  | -0.49206 | 1.61343  | -1.60124 | 1.3347   |
| FV2  | 0.074964 | -0.04422 | -1.13241 | -1.076   | -1.03669 | 0.892443 | -0.28591 | 0.286644 |
| FV3  | -0.35592 | -0.53326 | -2.1602  | -2.17709 | -2.18702 | 0.140433 | 0.614318 | -1.07913 |
| FV4  | 0.175982 | 0.105693 | -0.64438 | -0.64563 | -0.64602 | -0.5186  | 1.03266  | -0.88814 |
| FV5  | 0.628642 | 0.502577 | -1.12406 | -1.14935 | -1.16577 | -0.21237 | 0.579584 | -0.85744 |
| FV6  | -0.62921 | -0.68426 | -0.70616 | -0.70377 | -0.70162 | -0.13563 | 0.303316 | -0.50102 |
| FV7  | -0.45157 | -0.48124 | -0.37615 | -0.39992 | -0.41586 | -0.29803 | 0.373849 | -0.52123 |
| FV8  | -0.33564 | -0.20354 | 1.49427  | 1.46406  | 1.44233  | -0.78764 | 0.151234 | 0.036247 |
| FV9  | 0.590867 | 0.602193 | 0.27206  | 0.276483 | 0.27928  | -1.11991 | 0.927434 | -0.90147 |
| FV10 | 0.22638  | 0.088092 | -1.38032 | -1.38948 | -1.39471 | 1.06502  | -0.65092 | 0.260095 |
| FV11 | -0.16433 | -0.13515 | 0.398746 | 0.405408 | 0.409626 | -1.97122 | 1.75281  | -1.64789 |
| FV12 | 0.594048 | 0.701268 | 1.18566  | 1.19046  | 1.19285  | -0.8487  | 0.29071  | -0.13094 |
| FV13 | 0.967119 | 0.931502 | -0.15522 | -0.17027 | -0.18042 | 0.223356 | -0.25778 | 0.119766 |
| FV14 | -0.3197  | -0.3222  | -0.00883 | -0.02118 | -0.02961 | 1.86117  | -1.62691 | 1.70284  |
| FV15 | 0.515963 | 0.597647 | 0.879021 | 0.837199 | 0.808016 | -0.91843 | 0.89147  | -0.5007  |
| FV16 | 0.354464 | 0.395798 | 0.545974 | 0.545968 | 0.545559 | 1.88567  | -1.88637 | 2.05422  |
| FV17 | 1.06874  | 1.05598  | 0.114148 | 0.131581 | 0.143398 | 0.583121 | -0.77562 | 0.675527 |
| FV18 | 0.113948 | 0.183145 | 0.825079 | 0.823927 | 0.822517 | -0.11954 | -0.31218 | 0.360865 |
| FV19 | 0.08463  | 0.187547 | 1.15453  | 1.13971  | 1.12873  | -0.12222 | -0.4189  | 0.516424 |
| FV20 | -4.23141 | -4.20116 | -1.48922 | -1.49667 | -1.50067 | -1.32029 | 2.18996  | -2.12663 |
| FV21 | 0.559965 | 0.603578 | 0.586464 | 0.593826 | 0.598404 | 0.326579 | -0.68788 | 0.673523 |
| FV22 | 0.029439 | 0.165941 | 1.57182  | 1.60113  | 1.61995  | -0.93762 | 0.198484 | 0.042855 |
| FV23 | 0.17573  | 0.228979 | 0.708118 | 0.739158 | 0.759791 | 0.719067 | -0.8022  | 1.09132  |

Illustrative Example Showing Eight (Fa, Fb, ..., Fh) of 21 Standardized Features for 23 Feature Vectors (FV1, FV2, ..., FV23) in Training Set

FIG. 7C

Eigenvector for Fa':

0.314798  0.320505  0.187078  0.18811  0.188677  0.113247  0.20504  0.215383  0.026876

-0.06021  -0.03868  0.293741  0.319467  0.317961  0.315311  0.044042  0.028829  0.074159

-0.284135  0.22799  0.23506

Eigenvector for Fb':

0.083143  0.044013  -0.37407  -0.37378  -0.3733  0.244739  0.10757  0.027678  0.076991

0.10012  0.064885  0.148377  -0.05554  -0.07937  -0.09497  0.31197  -0.39818  0.303025

-0.18244  -0.09558  0.22189

Eigenvector for Fc':

-0.11989  -0.1123  0.046969  0.049609  0.051377  -0.401974  0.41823  0.413385  -0.51852

0.082295  0.08688  0.14479  0.06274  0.05559  0.05124  0.186101  0.19058  0.148608

-0.16944  0.016485  0.150023

Eigenvector for Fd':

0.02111  0.00885  -0.14227  0.138145  0.135227  -0.21361  0.154907  0.13136  0.03931

0.452016  0.512317  0.031187  -0.0444  0.03969  0.03597  -0.358679  -0.224295  0.334123

-0.09297  -0.28396  0.03115

Illustrative Example Showing Four (Fa', Fb', Fc', and Fd') of 21 Eigenvectors (each being a 1x21 vector) of the Transformation to an Eigenspace

FIG. 7E

|  | Fa' | Fb' | Fc' | Fd' | Fe' | Ff' | Fg' | Fh' |
|---|---|---|---|---|---|---|---|---|
| TFV1 | 0.149248 | 0.108443 | 0.069261 | 0.145343 | 0.001405 | 0.051524 | -0.06183 | 0.040857 |
| TFV2 | 0.058783 | 0.166279 | -0.23338 | -0.01033 | -0.03712 | 0.01981 | -0.15533 | -0.0734 |
| TFV3 | -0.0406 | 0.218438 | -0.27297 | -0.15611 | -0.30668 | -0.06561 | -0.17903 | -0.34072 |
| TFV4 | 0.144034 | 0.238641 | -0.05816 | 0.047284 | -0.46322 | -0.13525 | -0.18133 | -0.02436 |
| TFV5 | 0.00562 | 0.225293 | 0.003036 | 0.010143 | -0.58599 | 0.013917 | -0.08179 | -0.13723 |
| TFV6 | -0.05466 | 0.051157 | -0.18453 | -0.00937 | 0.128541 | -0.12361 | -0.0408 | -0.14021 |
| TFV7 | -0.03247 | 0.097759 | -0.2529 | -0.05698 | 0.372405 | -0.07646 | 0.051331 | -0.07369 |
| TFV8 | -0.22428 | -0.12089 | -0.118 | 0.152876 | 0.238919 | -0.05868 | -0.0037 | 0.147105 |
| TFV9 | 0.097111 | 0.236673 | 0.053207 | -0.11618 | -0.05451 | 0.189381 | 0.115575 | -0.11701 |
| TFV10 | -0.06871 | 0.252683 | -0.17639 | -0.17426 | 0.045646 | 0.166762 | 0.06033 | -0.1149 |
| TFV11 | 0.130411 | 0.111344 | -0.03796 | -0.00601 | -0.17294 | -0.11103 | 0.010407 | -0.09267 |
| TFV12 | -0.16584 | -0.15071 | 0.064362 | 0.077179 | -0.149 | 0.13227 | 0.152243 | 0.161454 |
| TFV13 | 0.036466 | 0.188337 | -0.07705 | -0.04242 | 0.099355 | 0.029909 | 0.152857 | 0.244927 |
| TFV14 | 0.016584 | 0.071548 | -0.03586 | 0.337556 | 0.202838 | -0.10747 | 0.069354 | 0.354763 |
| TFV15 | 0.103694 | -0.01638 | 0.141063 | -0.13376 | -0.15898 | 0.115628 | 0.080433 | 0.108908 |
| TFV16 | -0.13181 | -0.14396 | 0.299212 | 0.118825 | 0.037901 | 0.196515 | -0.02718 | 0.141573 |
| TFV17 | 0.12259 | 0.191198 | 0.04677 | 0.181004 | -0.23687 | -0.03986 | 0.215213 | 0.471425 |
| TFV18 | -0.2466 | -0.06349 | -0.00747 | -0.01128 | 0.278557 | 0.133782 | 0.003996 | -0.03933 |
| TFV19 | -0.13068 | -0.23122 | 0.194107 | -0.03128 | 0.204421 | 0.212686 | 0.057857 | -0.02746 |
| TFV20 | 0.734896 | -0.79129 | 0.082825 | -0.52507 | 0.652892 | -0.69494 | -0.32924 | -0.97828 |
| TFV21 | -0.17563 | -0.15856 | 0.158633 | 0.05776 | -0.05929 | 0.038578 | -0.02832 | 0.13063 |
| TFV22 | -0.07462 | -0.3666 | 0.1615 | -0.00219 | 0.050362 | -0.01867 | 0.076923 | 0.214557 |
| TFV23 | 0.038198 | -0.1147 | 0.180699 | 0.14728 | -0.08862 | 0.130828 | 0.042027 | 0.143078 |

Illustrative Example Showing Nine (Fa'-Fi') (of 21) Features for Training Set of 23 Transformed Feature Vectors (Post-Transformation)

FIG. 7F

|      | TFV1     | TFV2     | TFV3     | TFV4     | TFV5     | TFV6     | TFV7     | TFV8     |
|------|----------|----------|----------|----------|----------|----------|----------|----------|
| TFV1 | 0        | 0.768967 | 1.72279  | 1.77203  | 1.24915  | 0.905237 | 1.33275  | 1.4812   |
| TFV2 | 0.768967 | 0        | 0.495927 | 0.72034  | 0.83393  | 0.416983 | 0.995689 | 1.37798  |
| TFV3 | 1.72279  | 0.495927 | 0        | 0.904961 | 0.778737 | 0.828316 | 1.64039  | 2.62357  |
| TFV4 | 1.77203  | 0.72034  | 0.904961 | 0        | 0.404751 | 0.805955 | 1.26744  | 1.68164  |
| TFV5 | 1.24915  | 0.83393  | 0.778737 | 0.404751 | 0        | 1.04853  | 1.64855  | 2.06645  |
| TFV6 | 0.905237 | 0.416983 | 0.828316 | 0.805955 | 1.04853  | 0        | 0.232637 | 0.939551 |
| TFV7 | 1.33275  | 0.995689 | 1.64039  | 1.26744  | 1.64855  | 0.232637 | 0        | 1.13656  |
| TFV8 | 1.4812   | 1.37798  | 2.62357  | 1.68164  | 2.06645  | 0.939551 | 1.13656  | 0        |

Illustrative Example Showing Matrix of Pairwise Distances Between First Eight of 23 Transformed Feature Vectors

FIG. 7G

Proximity Metrics for 23 Transformed Feature Vectors:

| Index | X | Y | Fa | Fb | Fc | Fd | Fe | Ff | Fg | Fh |
|---|---|---|---|---|---|---|---|---|---|---|
| 1 | 2774 | 1559 | 689.796 | 676.769 | 0.846168 | 0.988976 | 1.19094 | 0.60703 | 0.800299 | 1.14287 |
| 2 | 2647 | 1560 | 652.06 | 654.572 | 0.854993 | 1.00212 | 1.21019 | 0.61032 | 0.800975 | 1.14029 |
| 3 | 2519 | 1560 | 669.112 | 660.386 | 0.848537 | 0.992562 | 1.19624 | 0.61575 | 0.81285 | 1.16166 |
| 4 | 2391 | 1559 | 690.064 | 680.949 | 0.848498 | 0.992529 | 1.19622 | 0.61509 | 0.811807 | -1.16 |
| 5 | 2264 | 1559 | 580.138 | 608.798 | 0.870216 | 1.02358 | 1.24048 | 0.61343 | 0.799339 | 1.13244 |
| 6 | 2136 | 1559 | 600.299 | 579 | 0.840482 | 0.981448 | 1.1808 | 0.58216 | 0.762788 | -1.0852 |
| 7 | 2017 | 1559 | 1221.03 | 1219.67 | 0.852836 | 0.998663 | 1.20489 | -0.6024 | 0.78978 | 1.12371 |
| 8 | 2951 | 1556 | 934.004 | 881.33 | 0.831406 | 0.967662 | 1.16036 | 0.59759 | 0.792224 | 1.13565 |
| 9 | 2900 | 1555 | 684.64 | 617.695 | 0.815001 | 0.945244 | 1.12944 | 0.59369 | 0.792378 | 1.14096 |
| 10 | 2017 | 1509 | 970.931 | 1004.63 | 0.86537 | 1.01667 | 1.23064 | 0.61999 | 0.811927 | 1.15406 |
| 11 | 2951 | 1492 | 733.63 | 721.394 | 0.847688 | 0.991836 | 1.19569 | 0.61471 | 0.811068 | 1.15874 |
| 12 | 2899 | 1492 | 814.193 | 760.634 | 0.82954 | 0.966921 | 1.16121 | 0.59667 | 0.789587 | 1.13054 |
| 13 | 2164 | 1487 | 743.981 | 726.409 | 0.844923 | 0.987717 | 1.18966 | 0.61142 | 0.807287 | 1.15391 |
| 14 | 2107 | 1487 | 846.953 | 789.583 | 0.827815 | 0.96355 | 1.15551 | 0.57295 | 0.753674 | 1.07523 |
| 15 | 2566 | 1474 | 560.657 | 555.17 | 0.850076 | 0.995099 | 1.20019 | 0.60279 | 0.79125 | 1.12671 |
| 16 | 2734 | 1447 | 712.154 | 633.43 | 0.808693 | 0.935638 | 1.11516 | -0.586 | 0.783641 | 1.12995 |
| 17 | 2951 | 1442 | 1168.02 | 1108.99 | 0.834773 | 0.973479 | 1.16964 | 0.59906 | 0.791982 | -1.1332 |
| 18 | 2899 | 1442 | 845.863 | 805.636 | 0.835578 | 0.974256 | 1.17038 | -0.5813 | 0.76383 | 1.08878 |
| 19 | 2485 | 1422 | 1168.46 | 1128.91 | 0.841138 | 0.98241 | 1.1822 | 0.59275 | 0.779271 | 1.11097 |
| 20 | 2371 | 1422 | 1287.48 | 1256.97 | 0.844904 | 0.987702 | 1.18965 | 0.59441 | 0.780285 | 1.11128 |
| 21 | 2255 | 1422 | 1117.51 | 1124.07 | 0.855696 | 1.00311 | 1.21159 | 0.60548 | 0.792995 | 1.12745 |
| 22 | 2951 | 1391 | 1131 | 1153.61 | 0.860622 | 1.01014 | 1.22159 | 0.64941 | 0.860479 | 1.23222 |
| 23 | 2900 | 1391 | 721.658 | 699.096 | 0.842569 | 0.984892 | 1.18617 | 0.61031 | 0.806015 | -1.1523 |
| 24 | 2776 | 1373 | 1061.94 | 1033.19 | 0.843862 | 0.986439 | 1.18807 | 0.59262 | 0.77769 | 1.10737 |
| 25 | 2694 | 1374 | 1010.62 | 1000.43 | 0.850538 | 0.996319 | 1.20249 | 0.60747 | 0.797865 | 1.13652 |
| 26 | 2598 | 1373 | 1071.47 | 1024.11 | 0.837126 | 0.976693 | 1.17407 | 0.59908 | 0.791099 | 1.13108 |
| 27 | 2527 | 1374 | 612.484 | 611.002 | 0.853211 | 1.00003 | 1.20766 | 0.61677 | 0.811537 | 1.15723 |
| 28 | 2399 | 1373 | 696.913 | 728.364 | 0.868369 | 1.0205 | 1.23565 | 0.61125 | 0.797182 | 1.13008 |
| 29 | 2283 | 1373 | 868.64 | 870.893 | 0.8541 | 1.0004 | 1.20731 | 0.59601 | 0.779139 | 1.10651 |
| 30 | 2193 | 1373 | 982.38 | 1066.77 | 0.882007 | 1.04072 | 1.26518 | 0.61595 | 0.797697 | 1.12534 |
| 31 | 2134 | 1373 | 947.898 | 990.56 | 0.869116 | 1.02234 | 1.23904 | 0.62363 | 0.815657 | 1.15832 |
| 32 | 2076 | 1373 | 939.373 | 1020.79 | 0.882332 | 1.04128 | 1.26607 | -0.62 | 0.803874 | -1.1349 |
| 33 | 2018 | 1373 | 1140.2 | 1203.95 | 0.87222 | 1.02634 | 1.24431 | 0.60463 | 0.784582 | 1.10851 |
| 34 | 2951 | 1340 | 1069.5 | 990.463 | 0.825293 | 0.959984 | 1.15047 | 0.60723 | 0.80916 | -1.1637 |
| 35 | 2900 | 1341 | 518.988 | 510.115 | 0.84751 | 0.991561 | 1.19528 | 0.65846 | 0.880593 | 1.26858 |

Illustrative Example Showing First 8 (Fa-Fh) of 21 Detected Characteristic Features for Solder Joint of 35 Pins Under Inspection

FIG. 8

METHOD AND APPARATUS FOR RAPID INSPECTION OF SUBCOMPONENTS OF MANUFACTURED COMPONENT

CROSS-REFERENCE TO RELATED APPLICATION(S)

This application claims the benefit of U.S. Provisional Application No. 62/854,769, filed on May 30, 2019. The aforementioned application is hereby incorporated herein by reference in its entirety.

BACKGROUND OF THE INVENTION

1. Field of the Invention

The present disclosure relates to methods and apparatus for defect detection using automated apparatus and methods.

2. Description of the Background Art

Integrated circuit packaging technologies have evolved and become more complex over time. Two-dimensional integrated circuit packaging has developed to accommodate increasingly dense connections and now includes, for example, dual-in-line packages, quad flat packages, pin grid arrays, and ball grid arrays.

Furthermore, three-dimensional (3D) integration is increasingly being employed in advanced packaging of integrated circuits. One example of such 3D packaging technology provides interconnections by way of an interposer between two or more semiconductor devices, a semiconductor device and a printed circuit board, or a semiconductor device and some other package component. The interposer may be a silicon wafer in which vias that pass through the silicon, and are filled with electrically conductive material, such as copper or tungsten, have been manufactured. An active silicon device may also function as an interposer.

When integrated circuits ("ICs," or "chips") are bonded to both sides of the interposer, the through-silicon vias (TSVs) allow signals from one IC to travel a relatively short distance vertically to another IC. When integrated circuits are bonded to a PCB using an interposer, the TSVs allow signals from the ICs on one side of the interposer to connect the PCB. Such TSVs may have an aspect ratio of 10:1 or more.

In certain advanced packaging solutions, a single interposer may serve as the interconnection between memory ICs, which contain billions of memory cells, and a logic IC for a microprocessor. Such an interposer may need many thousands of TSVs. These TSVs form vital communication links between logic and memory and their proper functioning is of critical importance.

SUMMARY

The present disclosure provides methods and apparatus for inspecting manufactured components to detect defects using a proximity metric. In an exemplary implementation, the presently-disclosed technology enables real-time detection of defects in subcomponents of a component using an x-ray imaging apparatus. The component may be, for example, a multi-chip package with silicon interposers and through-silicon vias. Other components may be inspected, and other imaging apparatus may be used in alternate implementations.

One embodiment relates to a method for inspecting multiple subcomponents of a component for defects, the method comprising, for each subcomponent undergoing defect detection: extracting a subcomponent image from image data of the component; computing a transformed feature vector from the subcomponent image; computing pairwise distances from the transformed feature vector to each transformed feature vector in a training set; determining a proximity metric using said pairwise distances; and comparing the proximity metric against a proximity threshold to detect a defect in the subcomponent.

Another embodiment relates to a product manufactured using a disclosed method of inspecting multiple subcomponents of a component for defects. Other embodiments, aspects and features are also disclosed.

DESCRIPTION OF THE DRAWINGS

FIGS. 7A, 7B, 7C, 7D, 7E, 7F, 7G, 7H and 7I show various steps in the flow chart of FIG. 1 using an illustrative example in accordance with an embodiment of the invention.

FIG. 8 shows characteristic features computed from 35 subcomponent images which are extracted from the high-resolution x-ray image of FIG. 2A in accordance with an embodiment of the invention.

DETAILED DESCRIPTION

Inspecting connections and other subcomponents within integrated circuit packages for manufacturing defects is increasingly problematic and challenging. These problems and challenges are, at least in part, due to the high-density and three-dimensional nature of advanced packaging technologies.

The present disclosure provides an advantageous technology for inspecting an object, such as, for example, a manufactured component for use in packaging integrated circuits, for defects. The disclosed technology includes methods and apparatus for the real-time inspection of the manufactured component to detect defects in relation to a large number of subcomponents of the component. In an exemplary use of the technology, all or a substantial portion of TSVs of an interposer with thousands of TSVs may be inspected in parallel in real-time to detect defects. Such real-time inspection may be used advantageously in a manufacturing line for statistical process control.

Figure 1:
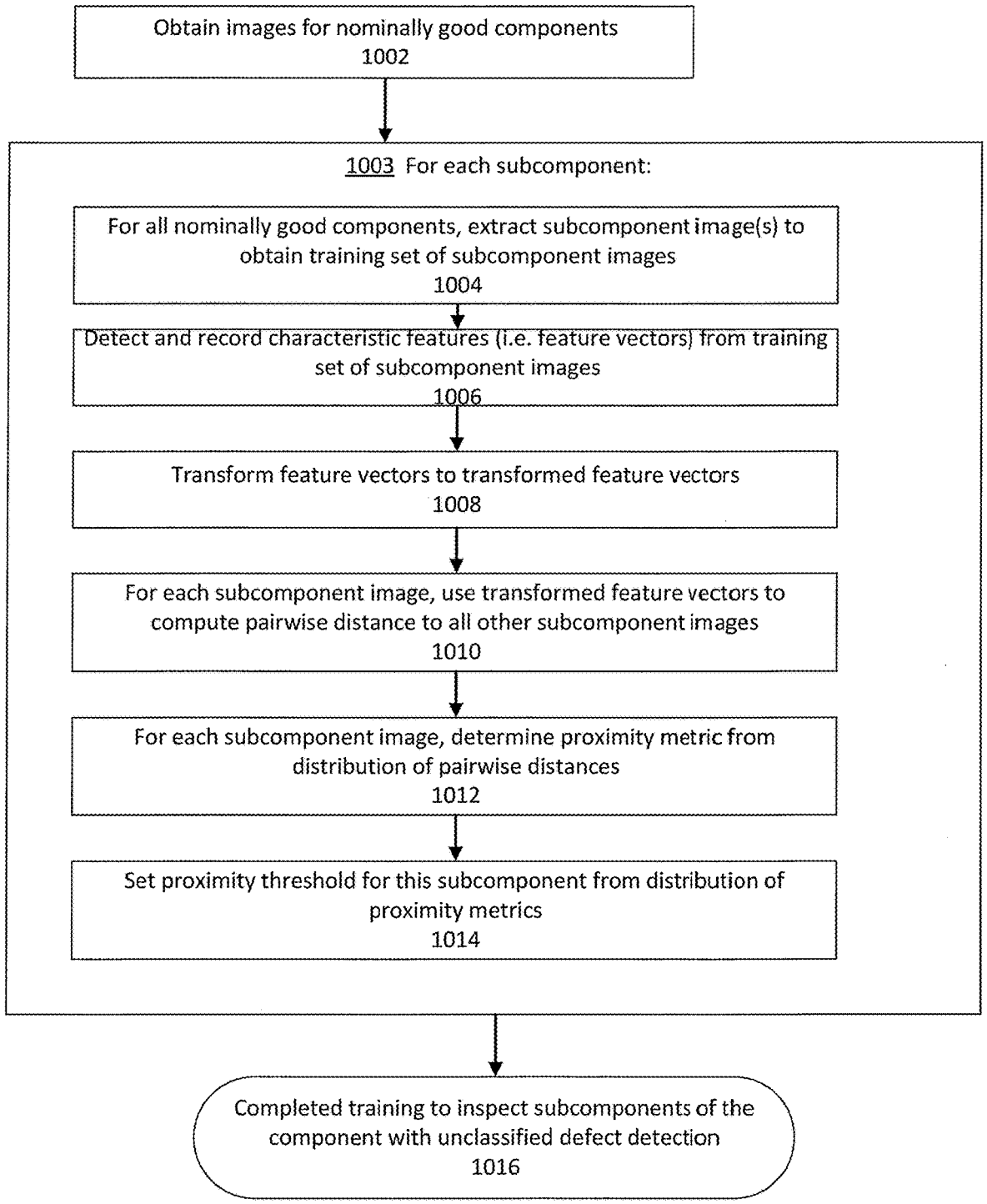
FIG. 1 is a flow chart of a method of using a training set of images of nominally-good components to prepare for the rapid inspection of subcomponents of a component in accordance with an embodiment of the invention.

FIG. 1 is a flow chart of a method 1000 to prepare for the rapid inspection of multiple subcomponents of a manufactured component in accordance with an embodiment of the invention. In an exemplary application, the component to be inspected may be, for example, an interposer having thousands of TSVs before final bonding to an integrated circuit chip. The subcomponents of the interposer may comprise electrical connections, such as the TSVs or other connections or design features of the interposer. In another application, the component to be inspected may be integrated circuit packaging which includes a chip-stack. The chip-stack may have many different connections, including TSVs, solder pins, and so forth, and other subcomponents which are to be inspected. In other applications, other types of objects with other kinds of subcomponents may also be inspected.

Per step 1002, images may be obtained for nominally good examples of the component to be inspected, each component having said multiple subcomponents. For example, if the component to be inspected is a specific interposer with thousands of TSVs, then a set of such interposers may be imaged, where the interposers in the set may be known to have defect-free or mostly defect-free subcomponents (for example, by testing them). In other words, each nominally good interposer in the set may have TSVs that are all, or mostly all, operational (i.e. properly conductive), though the TSVs will vary in actual structure and may not be perfectly manufactured.

Figure 2A:
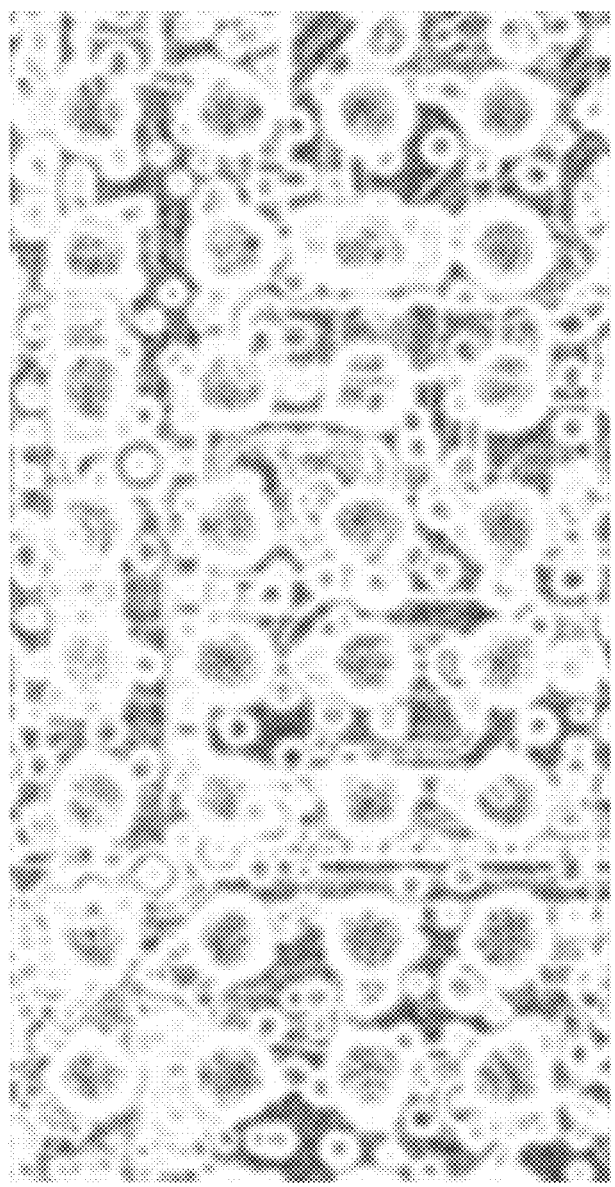
FIG. 2A shows an example high-resolution x-ray gradient image data for a portion of an integrated circuits packaging component which shows several subcomponents which may be inspected in accordance with an embodiment of the invention.

For purposes of illustration, consider FIG. 2A, which shows exemplary high-resolution x-ray gradient image data from a portion of an integrated circuits packaging component. An array of solder joints (for pins or other conductive connectors) is shown in the x-ray gradient image of FIG. 2A. Note that, instead of, or in addition to, x-ray gradient image data, x-ray convolution image data (i.e. image data after application of a convolution operator) may be used. Per step 1002, described above, such x-ray image data may be obtained.

Figure 2B:
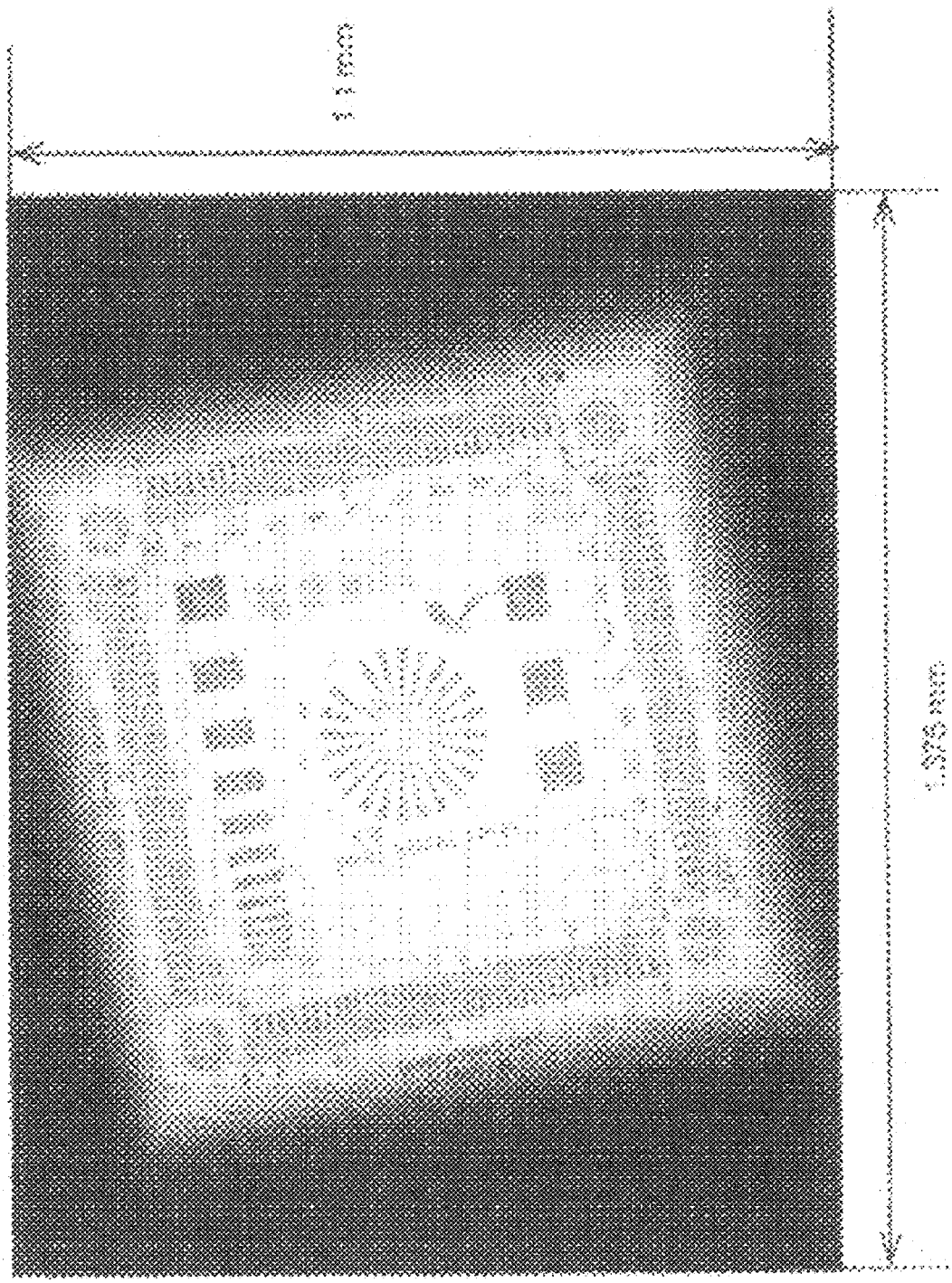
FIG. 2B shows example high-resolution x-ray image data from a test pattern of submicron features in gold on silicon for purposes of illustration.
Figure 2C:
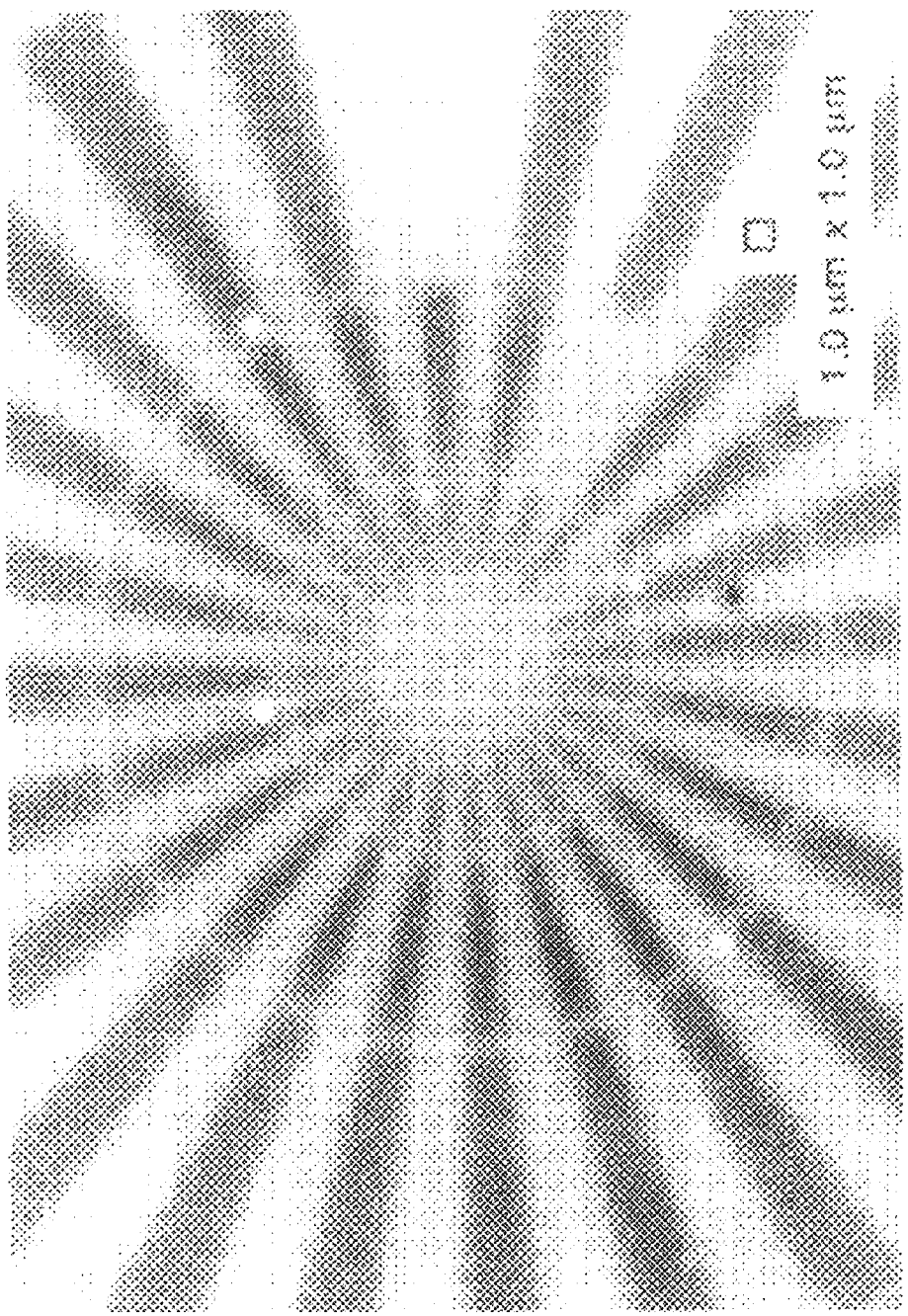
FIG. 2C shows a close-up view of a circular feature in the test pattern.

Note that the high-resolution x-ray gradient image data of FIG. 2A was obtained using an x-ray inspection microscope. An example of an x-ray inspection microscope is disclosed in U.S. Pat. No. 9,129,715 to Adler et al. The high-resolution capability of such an x-ray inspection microscope is shown by the x-ray image in FIG. 2B, which was obtained from a test pattern of submicron features in gold on silicon. FIG. 2C shows a close-up view of a circular feature in the test pattern.

Per block 1003, for each subcomponent, the steps shown in steps 1004 through 1014 may be performed. These steps may be performed for multiple subcomponents in parallel. In one implementation, an interposer may have several thousand TSVs at specified positions, and each of those TSV positions may be considered as a separate subcomponent. In another implementation, TSVs at a group of positions may be considered as equivalent such that each TSV at those equivalent positions may be considered as an instance of a single subcomponent. In one example, the equivalent positions may include those TSVs at similar corner positions, or similar in-line positions, in an array of TSVs. In another example, the equivalent positions may include all the TSVs of the interposer.

Per step 1004, for all nominally good example components that were imaged, a subcomponent image is (or subcomponent images are) extracted. This step provides, for each subcomponent, a training set of subcomponent images from the nominally good example components. Note that each non-equivalent subcomponent will have a separate training set of subcomponent images. Note further that this step does not require that all the subcomponents imaged in the training set be non-defective; a small percentage of subcomponents in the training set may actually be defective, and the method 1000 should still generally work.

Consider, for example, that a subcomponent of the component may be a single physical feature or detail (such as a specific solder joint to a pin or ball connection) from the high-resolution image data of FIG. 2A. A high-resolution subcomponent image (i.e. a sub-image) containing the specific physical feature or detail may be extracted in this example (per step 1004). As discussed above, besides solder joints of an integrated circuit packaging component, another example of a realistic use would be inspection of TSVs of an interposer, where a subcomponent image may be an image of a single TSV, for instance.

For example, a specific solder joint (designated as Pin0) from the component shown in FIG. 2A may be the physical feature or subcomponent under inspection. A set of nominally-good components may be x-ray imaged, and subcomponent images of Pin0 may be extracted to obtain the training set of subcomponent images per step 1004.

Per step 1006, characteristic features are detected and recorded from the training set of subcomponent images. The feature detection obtains a set of features may be used to characterize the subcomponent images. The number of characteristic features in the set may be reduced or limited to a smaller number of substantial characteristic features by eliminating insubstantial characteristic features. Each subcomponent image may then be described by its feature vector.

In an exemplary implementation, the detection of characteristic features may be performed using SURF feature detection, described in "Speeded-Up Robust Features: SURF" by Herbert Bay et al. in ECCV 2006, Part I, LNCS 3951, pp. 404-417, Springer-Verlag Berlin Heidelberg 2006. Advantageously, SURF feature detection is rotationally invariant. In another implementation, the detection of characteristic features may be performed using Haar filters so as to obtain Haar features. In another implementation, the detection of characteristic features may be performed by extracting Hu moments. In another implementation, the detection of characteristic features may be performed by using a histogram of oriented gradients (HoG).

Per step 1008, a transformation may be applied to the feature vectors (obtained per step 1006) to produce transformed feature vectors. Each transformed feature in a transformed feature vector may be a linear combination of the features in the corresponding feature vector, and the set of transformed features may form a basis which spans the feature space. In accordance with an embodiment of the invention, the transformation may involve standardizing the feature vectors, followed by a principal component analysis (PCA) transformation, to obtain the transformed feature vectors.

Figure 3A:
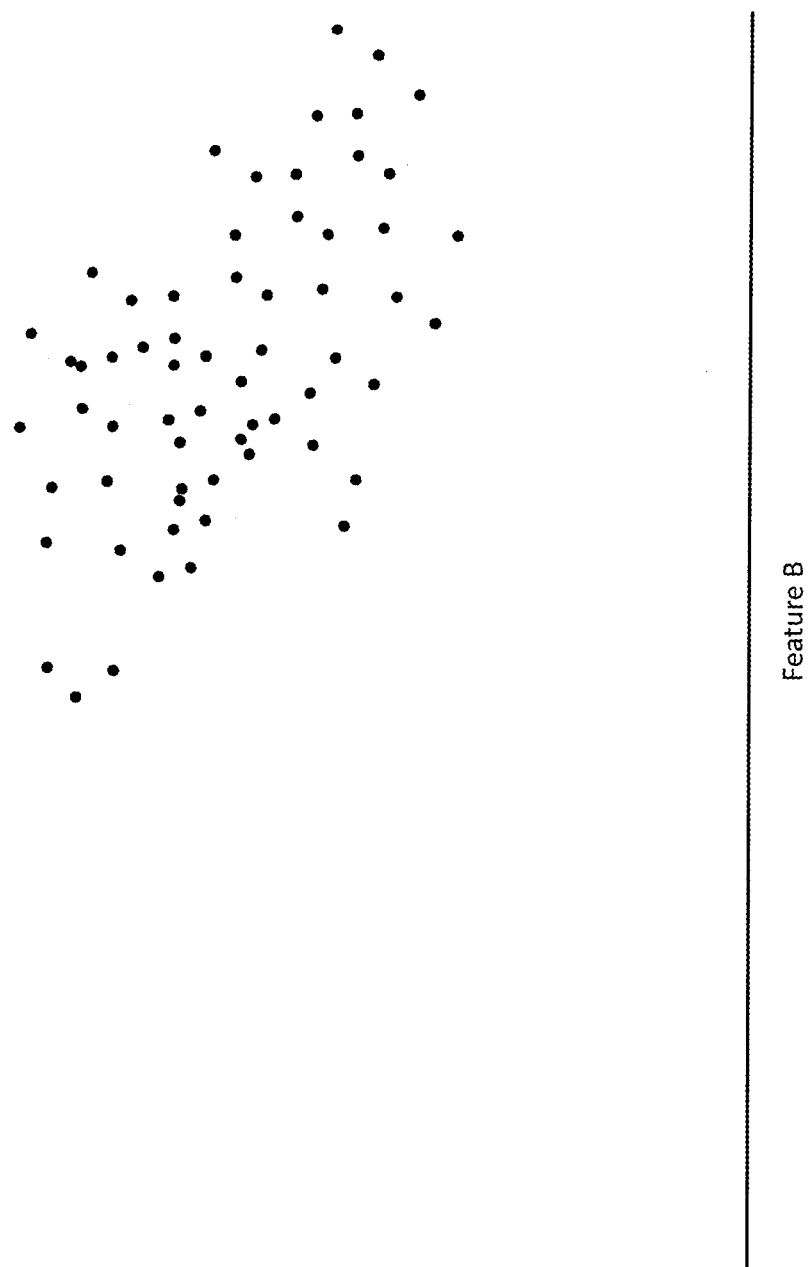
FIG. 3A depicts extracted characteristic feature vectors showing two feature-dimensions of a multi-dimensional feature space for a hypothetical training set in accordance with an embodiment of the invention.
Figure 3B:
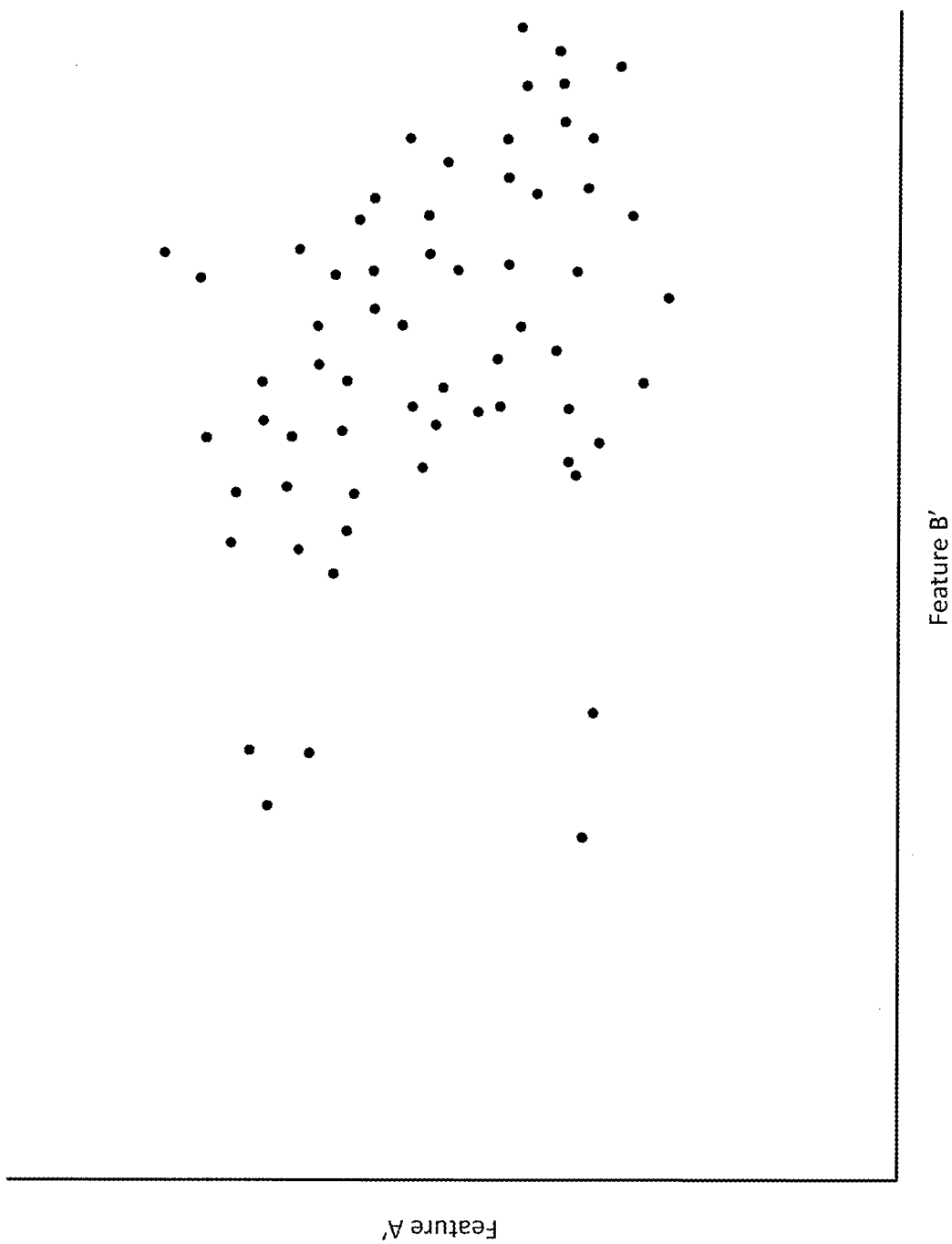
FIG. 3B depicts two feature-dimensions of transformed feature vectors for the hypothetical training set after transformation to an approximately uncorrelated, orthogonal multi-dimensional feature space in accordance with an embodiment of the invention.

In an exemplary implementation, the PCA transformation may involve a reduction in the feature set to only the top N components, where N is the reduced feature-dimensionality of the transformed feature space. The reduced feature-dimensionality advantageously reduces the amount of processing required and so speeds up the defect classification. The PCA transformation may further involve a linear transformation of the N-dimensional feature space to an N-dimensional eigenspace. To perform such a linear transformation to an eigenspace, N eigenvalues and N eigenvectors (which are characteristic vectors of the transformation) are determined and utilized. For purposes of understanding the advantage of the aforementioned PCA transformation of the feature vectors, consider FIGS. 3A and 3B. Detected feature vectors (obtained per step 1006) for a hypothetical training set is illustrated in FIG. 3A, where the depiction of the multi-dimensional feature space is simplified to show two-dimensions with Features A and B for ease of illustration. Each dot in FIG. 3A represents the feature vector for a subcomponent image from a training set of subcomponent images. Two dimensions of feature vectors for the hypothetical training set after transformation (transformed per step 1008) are depicted in FIG. 3B, where Features A' and B' are two dimensions of the transformed feature space. As discussed further below, the transformation of the feature space advantageously improves the capability and accuracy of the resultant defect detection system.

Per step 1010, pairwise distances are computed from the transformed feature vector of each subcomponent images to the transformed feature vectors of all other equivalent subcomponent images in the training set. In an exemplary implementation, because the transformed feature vectors have been transformed so as to be described in terms of the basis of the transformed features (per step 1008), the pairwise distance between two transformed feature vectors may be computed as a dot product of the pair of vectors.

Figure 3C:
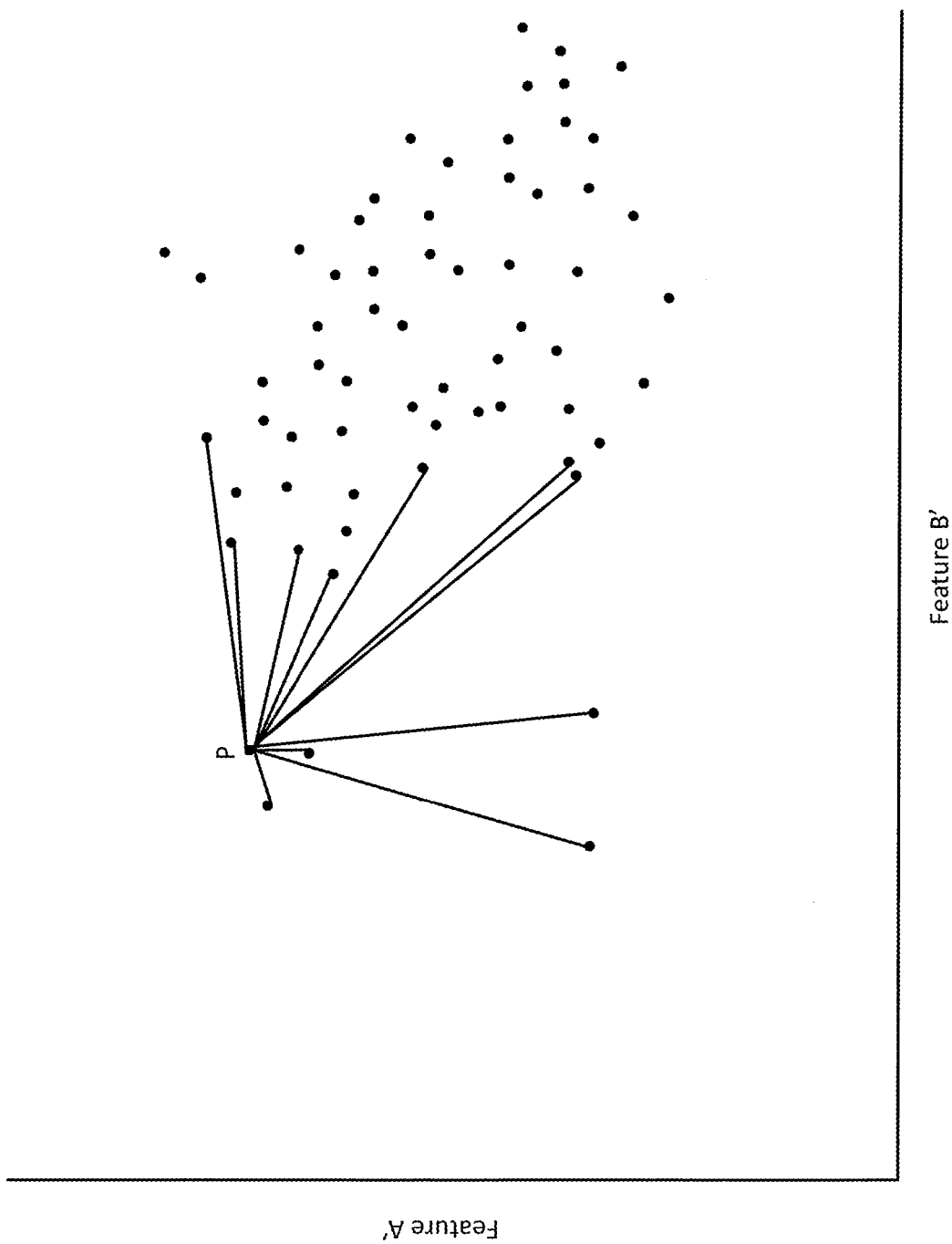
FIG. 3C depicts example pairwise distances (in the two depicted feature-dimensions) from one transformed feature vector (P) to nearby other transformed feature vectors of the hypothetical training set in accordance with an embodiment of the invention.

Example pairwise distances from one feature vector (P) to nearby other feature vectors in the hypothetical training set are depicted in FIG. 3C. Note that the pairwise distances would be computed from each feature vector (representing one subcomponent image) to all other feature vectors (representing all the other subcomponent images) in a training set. While only two feature dimensions are depicted in FIG. 3C for purposes of ease of illustration, the pairwise distances are computed by the dot product involving all the dimensions of the transformed feature space.

Per step 1012, a proximity metric is determined for each subcomponent image using the distribution of pairwise distances from its feature vector to the feature vectors of all other equivalent subcomponent images in the training set. In an exemplary implementation, the proximity metric for a subcomponent is determined to be the pairwise distance at a set percentile level in its distribution of pairwise distances. In other words, the proximity metric may be the pairwise distance at the X % level in the distribution, where the X % level means that X % of the pairwise distances for this subcomponent are shorter than the proximity metric. In one example, X %=1% such that 1% of the pairwise distances for this subcomponent are shorter than the proximity metric. In other examples: X %=2%; X %=0.5%; and X=0.1%. Generally, X % will be set to a low percentile, but the specific percentile used for X % may vary depending upon the implementation.

Figure 3D:
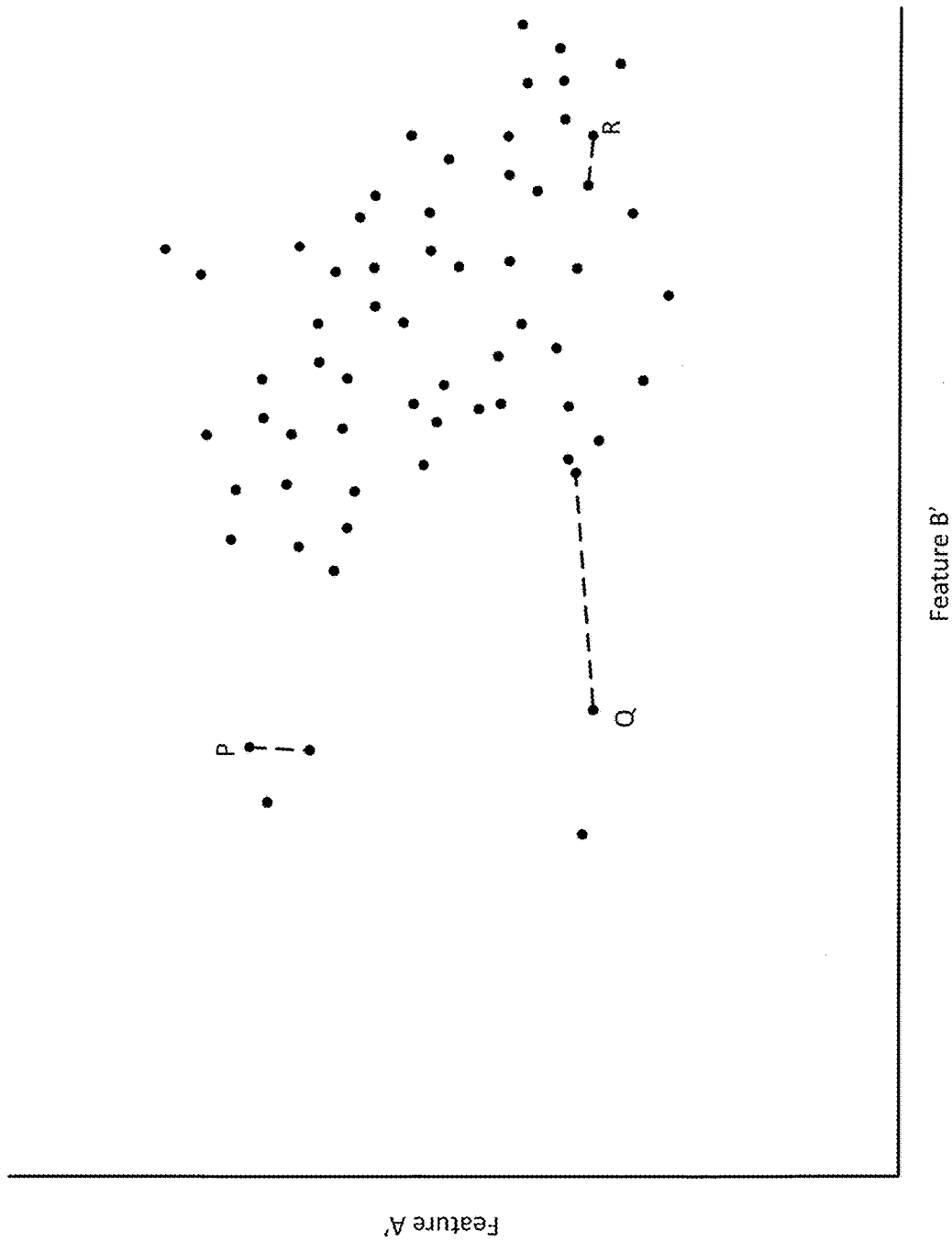
FIG. 3D depicts proximity metrics (in the two depicted feature-dimensions) for a few transformed feature vectors in the hypothetical training set in accordance with an embodiment of the invention.

As a simple example, consider for the transformed feature vectors in FIG. 3B that the X % level and the number of transformed feature vectors was such that the proximity distance is the pairwise distance to the second nearest neighbor. That may be the case, for example, if there were 200 transformed feature vectors in the training set, and X %=1%. Consider the transformed feature vectors labeled P, Q, and R in FIG. 3D. For these example transformed feature vectors, the proximity metric for P and R would be relatively small dot-product distances (as indicated by the dashed lines originating at P and R, respectively) because they each have a second nearest neighbor that is relatively close. However, the proximity metric for Q would be a relatively large dot-product distance (as indicated by the dashed line originating at Q) because its second nearest neighbor is relatively far way. Per step 1014, a proximity threshold is determined for each subcomponent image using the distribution of proximity metrics. In an exemplary implementation, the proximity threshold may be the proximity metric at the Y % level in the distribution. In one example, Y %=99% such that 99% of the pairwise distances for this subcomponent are shorter than the proximity metric. In another example, the proximity metric may be set to the maximum pairwise distance in the distribution (which may be considered to be the Y %=100% level). Such example levels for the proximity metric are depicted in the hypothetical distribution of proximity metrics FIG. 4.

Figure 4:
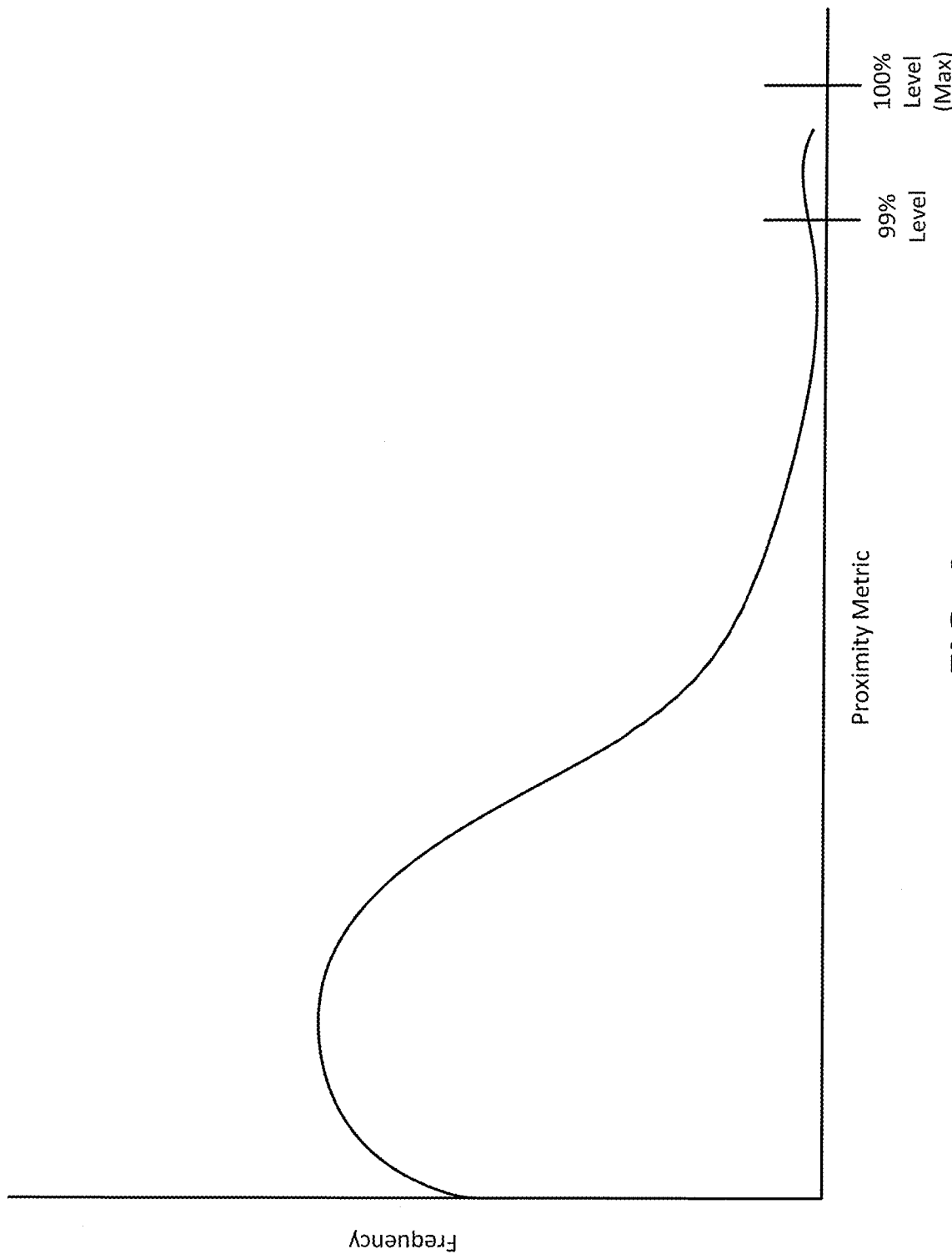
FIG. 4 depicts a hypothetical distribution of proximity metrics of a training set in accordance with an embodiment of the invention.

As shown in FIG. 4, there is a maximum (100% level) of the proximity metric. For instance, in the above-discussed example where the proximity metric corresponds to the pairwise distance to the second nearest neighbor, the maximum (100% level) of the proximity metric would be the longest pairwise distance between any of the transformed feature vector and its second nearest neighbor.

As further shown in FIG. 4, the proximity metric at the 99% level in the distribution may be determined and used as the proximity threshold. For instance, in the above-discussed example, where the proximity metric corresponds to the pairwise distance to the second nearest neighbor, the 99% level of the proximity metric would be the $99^{th}$-percentile longest pairwise distance between any of the transformed feature vector and its second nearest neighbor.

An illustrative example showing various steps of the method 1000 described above in relation to FIG. 1 is now described in relation to FIGS. 7A through 7I. In this illustrative example, x-ray images are obtained, per step 1002, for 23 nominally good integrated circuit packaging components of the same type as shown in the image of FIG. 2A.

Per step 1004, a subcomponent image of Pin0 is extracted from the x-ray image of each of the nominally-good components. Together, these subcomponent images form a training set of 23 subcomponent images.

Per step 1006, for each subcomponent image in the training set, characteristic features detected and recorded. FIG. 7A shows the detected characteristic features in this example. In particular, FIG. 7A shows eight (Fa, Fb, Fc, Fd, Fe, Ff, Fg, and Fh) of 21 characteristic features of 23 feature vectors (FV1, FV2, . . . , and FV 23), each feature vector corresponding to one of the subcomponent images (i.e. for a Pin0 sub-image of one of the nominally-good components) in the training set. Note that while the actual number of characteristic features is 21 for each feature vector, eight features of the feature vector are shown in FIG. 7A for purposes of brevity.

In this case, the specific technique used to detect the characteristic features involved generating two sets of features: a first set of features from a gradient subcomponent image; and a second set of features from a convolution subcomponent image. The features include measurements of differential integrals at an integration diameter and statistical values around the point of inspection (i.e. the solder joint or other physical feature). Note, however, that many other techniques may be used instead to detect the characteristic features, such as, for example, the SURF feature detection, Haar feature detection, detection by extracting Hu moments, HoG feature detection, and so on.

As described above, the transformation of step 1008 may include standardization, followed by a PCA transformation. As shown in this example, standardizing the feature vectors may involve generating mean and standard deviation statistics for the characteristic features.

To illustrate, FIG. 7B shows, for each of the first eight of 21 features, the mean (in the first row) and the standard deviation (in the second row). The mean and standard deviation values of FIG. 7B are used to normalize the feature vectors to obtain the standardized feature vectors shown in FIG. 7C. In an exemplary implementation, the standardization of features involves a process of subtracting the mean and dividing by the variance on a column-wise basis of the training samples. The standardization technique applied may depend on the particular application.

As described above in relation step 1008, following the standardization of the feature vectors, a PCA transformation may be applied which may involve a linear transformation of the N-dimensional feature space to an N-dimensional eigenspace. To perform such a linear transformation to an eigenspace, N eigenvalues and N eigenvectors (which are characteristic vectors of the transformation) are determined and utilized. To illustrate, FIGS. 7D and 7E provide, respectively, the eigenvalues and a first several of the eigenvectors of such a linear transformation of the standardized feature vectors. In this example, the eigenvalues are 21 in number, and the eigenvectors each have 21 feature-dimensions. All 21 of the eigenvalues are shown in FIG. 7D, and four of the 21 eigenvectors are shown in FIG. 7E. The eigenvectors are basis vectors for the transformed feature space (the eigenspace), and the eigenvalue corresponding to a eigenvector is the factor by which the eigenvector is scaled.

The result of step 1008 include transformed feature vectors (post-transformation feature vectors). Each of the 23 rows in FIG. 7F shows the first eight (Fa', Fb', Fc', Fd', Fe', Ff', Fg', and Fh') of 21 transformed features for the 23 transformed feature vectors (TFV1, TFV2, TFV23) of the training set. Note that while the actual number of transformed features is 21 for each transformed feature vector, the first eight transformed features of the transformed feature vector are shown in FIG. 7F for purposes of brevity.

Figures 7G, 7H:
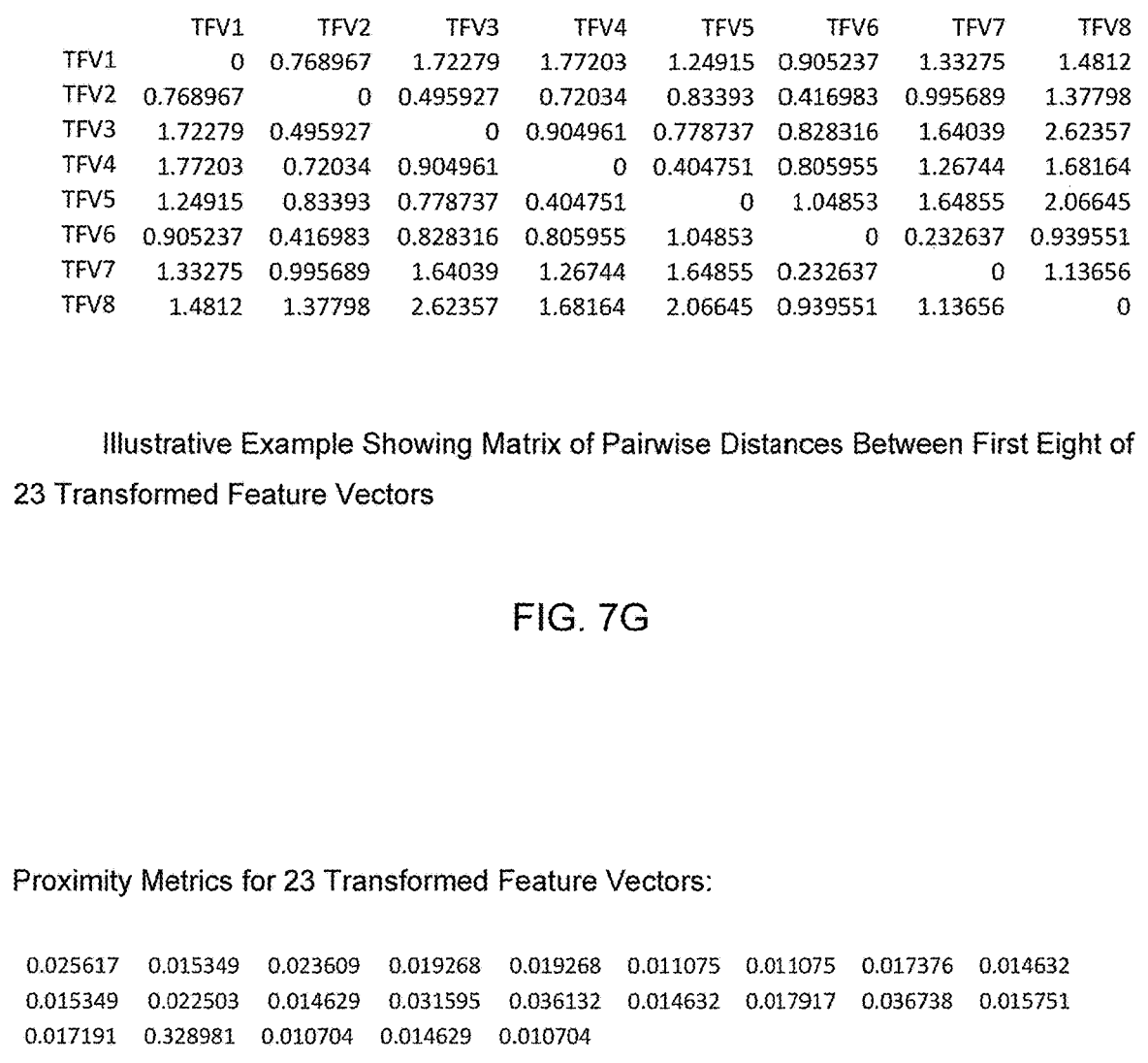

Per step 1010, pairwise distances may be computed between each transformed feature vector and the each of the other 23 transformed feature vectors. Pairwise distances between the transformed feature vectors (TFV1, TFV2, TFV23) may be generated using a dot product operation. For purposes of illustration, FIG. 7G shows a matrix of pairwise distances between each of the first eight (TFV1, TFV2, . . . , and TFV8) of 23 transformed feature vectors.

Figure 7I:
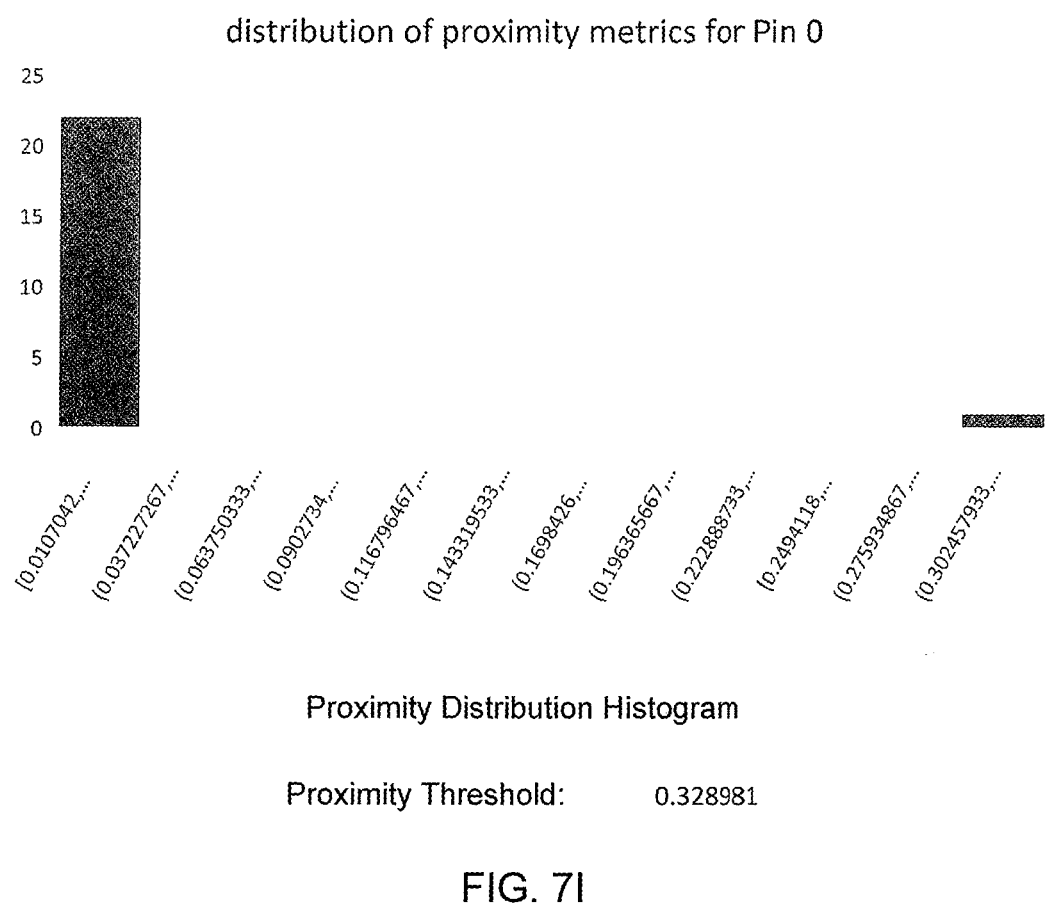

Per step 1012, a proximity metric may be determined for each of the 23 transformed feature vectors using the pairwise distances. In this example, the proximity metric may be the pairwise distance at the 5% level in the pairwise distance distribution, where the 5% level means that 5% of the pairwise distances for this subcomponent (i.e. for this transformed feature vector) are shorter than the proximity metric. Since there are 23−1=22 neighbors, we multiply 5% by 22 to get 1.1, which rounds to 1. This means that the $1^{st}$ farthest neighbor's distance is the proximity metric for each subcomponent (i.e. for each transformed feature vector). The resultant proximity metrics for the 23 transformed feature vectors are shown in FIG. 7H. A histogram showing the proximity metric distribution is shown in FIG. 7I.

Per step 1014, a proximity threshold may be determined from the proximity metric distribution. For example, the proximity threshold may be at the 99% level in the proximity metric distribution. In this case, since there are 23 proximity metrics, we multiply 99% by 23 to get 22.77, which rounds to 23. This means that the proximity threshold is set to the $23^{rd}$ (i.e. the highest) proximity metric, as indicated in FIG. 7I.

Figure 5:
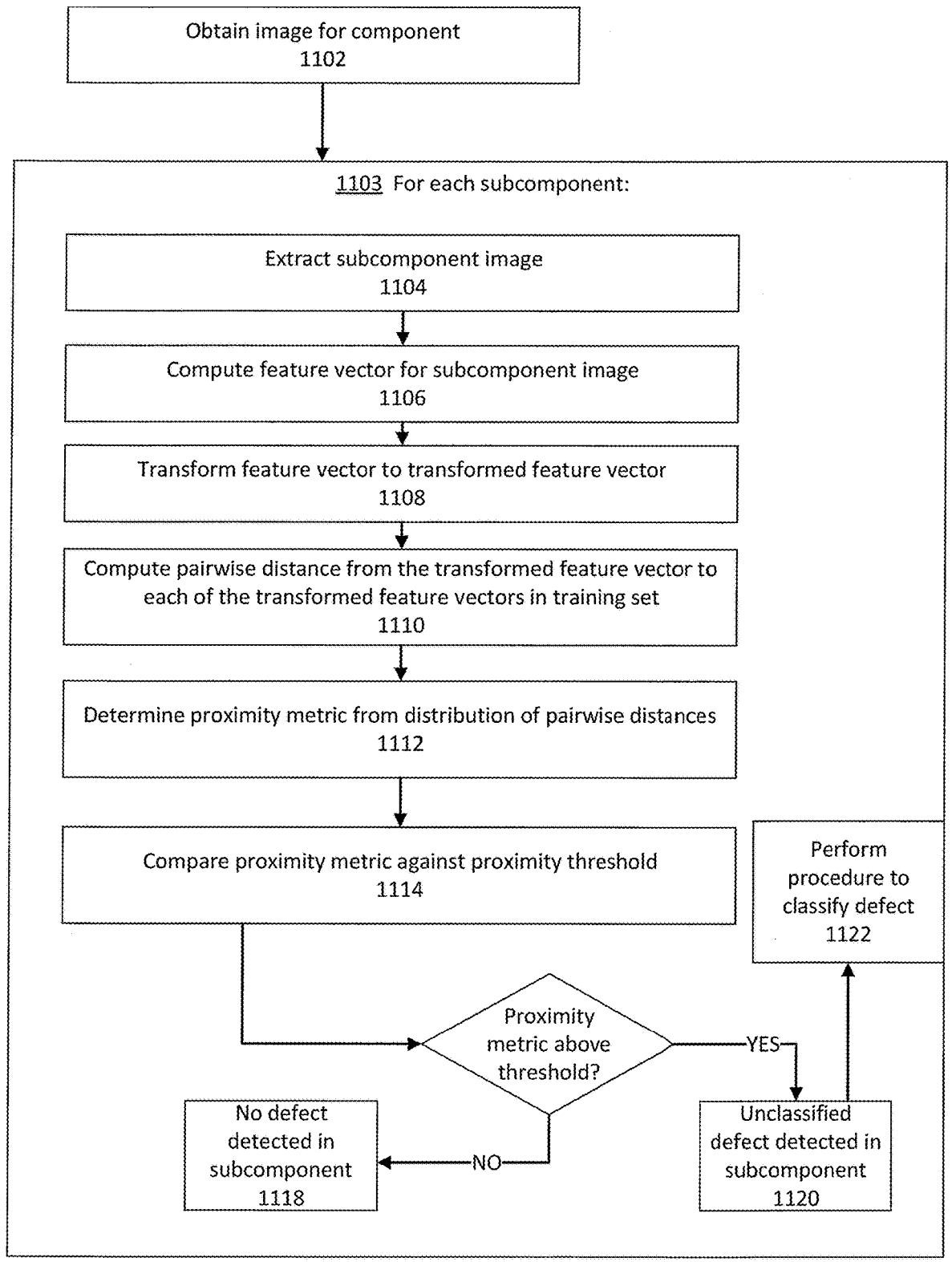
FIG. 5 is a flow chart of a method of rapidly inspecting subcomponents of a component in accordance with an embodiment of the invention.

FIG. 5 is a flow chart of a method 1100 of rapidly inspecting subcomponents of a component in accordance with an embodiment of the invention. This inspection method 1100 may be performed after the proximity-metric determination method 1000.

Per step 1102, a high-resolution image for the component to be inspected is obtained. The high-resolution image may be obtained in a same or similar manner as the high-resolution images obtained in step 1002 of FIG. 1, such as by using an x-ray inspection microscope, such as described below in relation to FIG. 6.

Per step 1103, for each subcomponent, the steps shown in steps 1104 through 1120 may be performed. These steps may be performed for each of multiple subcomponents in parallel. In one implementation, an interposer may have several thousand TSVs at specified positions, and each of those TSV positions may be considered as a separate subcomponent to be inspected using steps 1104-1120.

Per step 1104, the subcomponent image under defect detection is extracted from the component image. The subcomponent image corresponds to a subcomponent for the component which was pre-processed using the steps (1004-1014) in block 1003 of FIG. 1.

Per step 1106, values of the detected characteristic features are computed for the subcomponent image. In other words, values for the set of characteristic features, which were detected from the training set in step 1006 of FIG. 1, are computed so as to generate a feature vector for this subcomponent image.

Continuing the illustrative example discussed above in relation to FIGS. 7A-7I, FIG. 8 shows 35 such computed feature vectors, each corresponding to a different subcomponent image within an x-ray image of a component. The first column (Index) provides an index number for an extracted subcomponent image (extracted per step 1104) corresponding to a specific physical feature (in this case, the solder joint for Pin0) within the high-resolution x-ray image data of FIG. 2A. The second (X) and third (Y) columns provide the x-coordinate and y-coordinate indicating the location of that subcomponent image within the x-ray image data. The fourth through eleventh (Fa, Fb, Fc, Fd, Fe, Ff, Fg, and Fh) columns provide values for eight computed characteristic features for that subcomponent image (computed per step 1106). Note that while eight features are shown in FIG. 8 for purposes of brevity, the actual number of features computed for each subcomponent image of the specific pin (Pin0) was 21. Per step 1108, the feature vector may be transformed to a transformed feature vector. The transformation performed is the same transformation applied to the feature vectors of the training set in step 1008 of FIG. 1 and may involve standardizing the feature vectors, followed by a PCA transformation, to obtain the transformed feature vectors Per step 1110, pairwise distances are computed from the transformed feature vector of the subcomponent image under defect detection to the transformed feature vectors of the training set for that subcomponent image. The transformed feature vectors of the training set were the transformed feature vectors resulting from step 1008 of FIG. 1. In an exemplary implementation, the pairwise distance between two transformed feature vectors may be computed as a dot product of the pair of vectors. Advantageously, these dot-product pairwise distances between transformed feature vectors have been determined by the applicant to be useful in defect detection. In comparison, if such dot-product computations were used on the detected feature vectors (i.e. before transformation), then the pairwise distances would be less useful for defect detection.

Figure 3E:
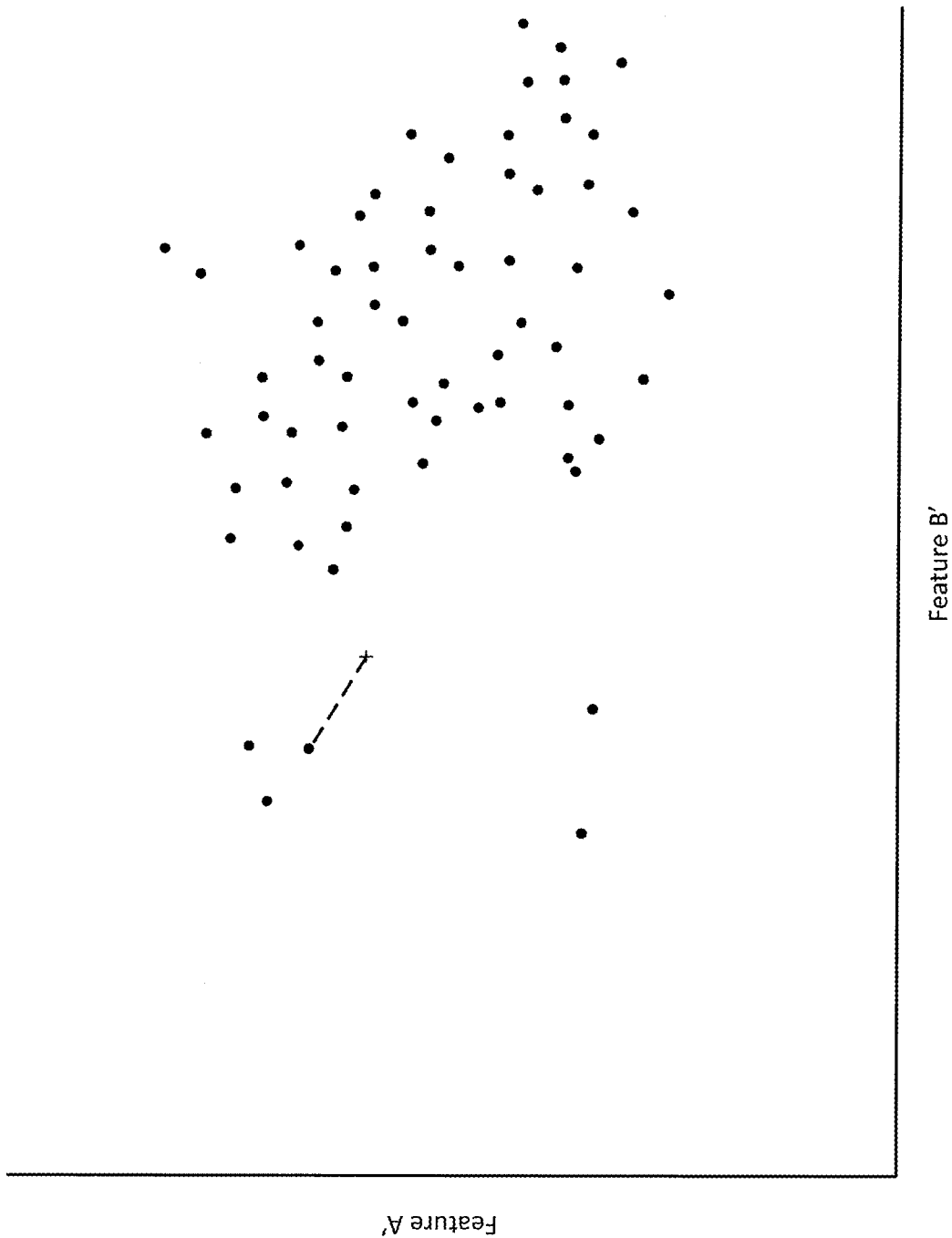
FIG. 3E depicts a proximity metric (in the two depicted feature-dimensions) for an example transformed feature vector for a subcomponent image under defect detection in relation to transformed feature vectors of the hypothetical training set in accordance with an embodiment of the invention.

Per step 1112, a proximity metric is determined for the subcomponent image under defect detection using the distribution of pairwise distances from its feature vector to the feature vectors in the training set of subcomponent images. Consider, for example, the transformed feature vectors depicted in FIG. 3E, where the dots represent the transformed feature vectors of the training set (same as from FIG. 3B), and the plus (+) symbol represents the transformed feature vector for the subcomponent image under inspection. Also consider, again, that the X % level and the number of transformed feature vectors was such that the proximity distance is the pairwise distance to the second nearest neighbor. In this example, the proximity metric for the subcomponent image under inspection is of moderate length (as indicated by the dashed line). This is because, although the transformed feature vector (+) being inspected is outside the largest cluster of transformed feature vectors, its second nearest neighbor is still relatively nearby.

Per step 1114, the proximity metric for the subcomponent image under defect detection is compared against the proximity threshold which was determined in step 1014 of FIG. 1. If the proximity metric is below the proximity threshold, then per step 1118 a determination may be made that no defect is detected based on the subcomponent image.

On the other hand, if the proximity metric is above the proximity threshold, then per step 1120 a determination is made that a defect has been detected in the subcomponent based on its image. At this point, the detected defect is unclassified in that no classification is made as to the type of defect. For example, whether the defect might be a void or short circuit or other type is undetermined.

Per step 1122, the method 1100 may perform a further procedure to classify the detected defect. Various defect classification techniques may be utilized.

Exemplary Implementation in a High-Speed X-Ray Imaging System

The presently-disclosed technology enables real-time unclassified defect detection for a multitude of subcomponents within a component. In one implementation, the presently-disclosed technology may be implemented in conjunction with a high-speed x-ray imager, such as that disclosed by Adler et al. in U.S. Pat. No. 9,129,715, or an instrument with a conventional x-ray microscope geometry.

In U.S. Pat. No. 9,129,715, issued Sep. 8, 2015, Adler et al. discloses an innovative x-ray microscope with a high flux x-ray source that allows high speed metrology or inspection of objects such as integrated circuits (ICs), printed circuit boards (PCBs), and other IC packaging technologies. The object to be investigated is illuminated by collimated, high-flux x-rays from an extended source having a designated x-ray spectrum. The system also comprises a stage to control the position and orientation of the object; a scintillator that absorbs x-rays and emits visible photons positioned in very close proximity to (or in contact with) the object; an optical imaging system that forms a highly magnified, high-resolution image of the photons emitted by the scintillator; and a detector such as a CCD array to convert the image to electronic signals.

Figure 6:
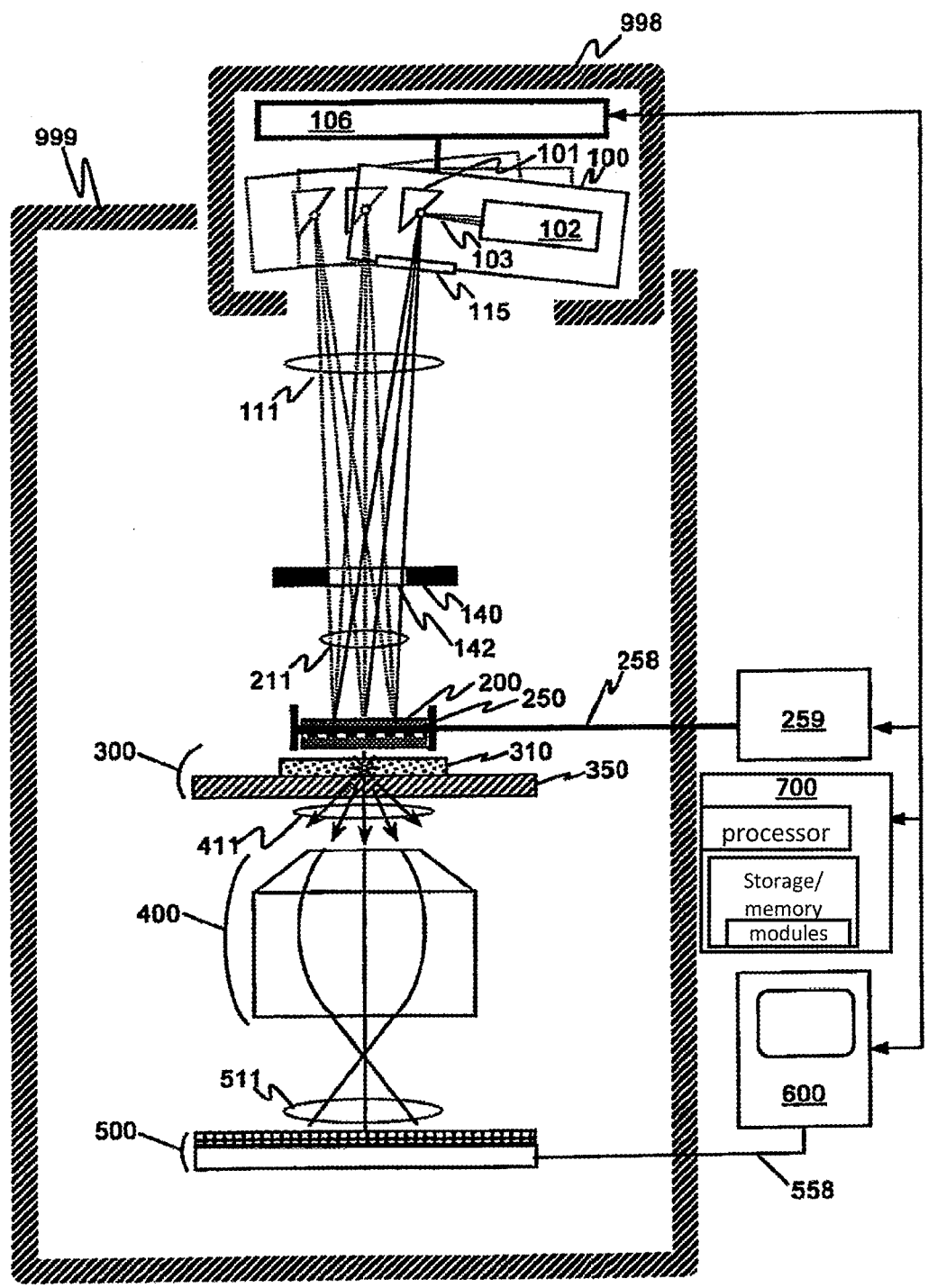
FIG. 6 illustrates an overview in cross-section of a high-speed x-ray imaging system in accordance with an embodiment of the invention.

FIG. 6 illustrates an overview in cross-section of an embodiment of a high-speed x-ray imaging system in accordance with a preferred embodiment of the invention. An x-ray emitter 101 emits x-rays 111. These x-rays are then shaped into a collimated x-ray beam 211, in some embodiments using distance from the emitter 101 and a plate 140 with an aperture 142. This collimated x-ray beam 211 then illuminates an object 200 to be examined. The x-rays that are transmitted through the object 200 illuminate a scintillator assembly 300 comprising a scintillator 310 and, in some embodiments, a support 350 for the scintillator. The scintillator 310 absorbs a portion of the x-rays and releases some of the energy so absorbed with the emission of visible photons 411.

Using an optical system 400, a magnified image 511 of the visible photons 411 emitted by the scintillator is formed on an image detector 500. The image detector 500 converts the intensity of the magnified image 511 to an electronic signal. The image detector 500 can comprise an electronic sensor, such as a charge-coupled device (CCD), or another image sensor known to those skilled in the art. The electronic signal is transmitted through a connector 558 to a system of electronics and processing 600 that, in some embodiments can display the image results, and in some embodiments can store the image results and/or perform image processing algorithms on the image results in conjunction with one or more computer systems 700.

For any source emitting ionizing radiation such as x-rays, it is often wise to provide shielding 998 around the x-ray source 100, and in some situations legally required for operation. Such shielding 998 can be a simple enclosure of shaped sheets of lead metal, or a more intricate design fabricated from any of a number of x-ray absorbing materials, such as lead-doped glass or plastic, that will be known to those skilled in the art. Shielding is desirable to keep random x-rays, either directly from the emitter 101 or reflected from some other surface, from causing unwanted effects, particularly spurious signals in the various electronic components used to control the system.

Likewise, for some embodiments, additional shielding 999 around the beam path may also be desired, and in some cases be legally required for operation. Such additional shielding 999 can be a simple enclosure of shaped sheets of lead metal, or a more intricate design fabricated from any of a number of x-ray absorbing materials such as lead-doped glass or plastic, that will be known to those skilled in the art. Additional shielding 999 is desirable to keep random x-rays, either directly from the emitter 101 or reflected from some other surface, from causing unwanted effects, particularly spurious signals in the various electronic components used to control the system.

Because certain image detectors 500 such as those comprising CCD sensors can be particularly sensitive to x-ray exposure, in some embodiments a portion of the scintillator assembly 300 may also be fabricated in whole or in part using a material, such as a lead-doped glass, which absorbs x-rays while transmitting the visible photons 411 emitted by the scintillator.

The apparatus for the x-ray source may include a mount 106 that can move the position of the x-ray source 100 relative to the object 200, thereby changing the angle of incidence of the x-ray beam on the object. The mount 106 can be designed to allow the x-ray source 100 to swing in the x-z plane, in the y-z plane, or any other combination of axes. The source can also be moved along the z-axis to move the x-ray source 100 closer to the object 200. This may have the effect of making the beam brighter, increasing signal strength, at the cost of having an x-ray beam that is less collimated, reducing resolution. This effect may be reduced or eliminated by reducing the spot size of the x-ray source.

Motion of the x-ray source 100 using the mount 106 may be controlled by the computer system 700 several ways. In some embodiments, the source mount 106 may move the x-ray source 100 to a fixed location to allow an image to be captured. In some embodiments, the mount 106 can move the x-ray source 100 continuously as images are gathered, allowing the dynamic change of x-ray intensity as transmitted through the object 200 to be recorded as a function of illumination angle. In some embodiments, the x-ray emitter 101 may be moved to at least 10 degrees off the normal incidence angle.

In some embodiments, further adjustment of the angle of incidence of the x-ray beam 211 on the object 200 may be achieved by coordinating the motion of the x-ray source 100 using the source mount 106 with the motion of the object 200 using the object mount 250. In some embodiments, the motion of the mount 250 is controlled by a controller 259 through a connector 258. The controller 259 is in turn directed either by direct input from an operator, or by electronic instructions provided by the computer system 700.

In some embodiments, the shielding 998 will be designed to enclose the x-ray source 100 and the source mount 106. In other embodiments, the shielding 998 can be designed to only enclose the x-ray source, with the mount 106 designed to move the shielding 998 as it moves the x-ray source 100.

In some embodiments of the invention, multiple x-ray sources may be used to produce images with different angles of incidence. The x-ray sources may be fixed in space or moveable, and they may be operated sequentially or simultaneously. The x-ray sources may be operated manually or controlled by one or more computer systems 700.

In accordance with an embodiment of the invention, the computer system 700 include one or more processors, data storage, and data memory, among other components. The computer system 700 may include, in data storage and/or data memory, software modules with executable instructions for detecting defects in subcomponents accordance with the methods disclosed herein.

CONCLUSION

In the present disclosure, numerous specific details are provided, such as examples of systems, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method for inspecting interior features corresponding to multiple subcomponents of a component for defects, the method comprising, for each subcomponent undergoing defect detection:
    inspecting an interior feature corresponding to a subcomponent of a component with an x-ray imaging system during x-ray imaging system operation;
    creating x-ray image data of the component during x-ray imaging system operation;
    extracting a subcomponent image corresponding to the interior feature from the x-ray image data of the component;
    computing a transformed feature vector from the subcomponent image;
    computing pairwise distances from the transformed feature vector to each transformed feature vector in a training set;
    determining a proximity metric using said pairwise distances;
    comparing the proximity metric against a proximity threshold to detect a defect in the subcomponent;
    the transformed feature vector corresponds to a characteristic feature of submicron size; and
    the method simultaneously evaluates the multiple subcomponents during parallel procedural steps.

2. The method of claim 1, wherein the component comprises a semiconductor package.

3. The method of claim 2, wherein the subcomponent comprises a through-silicon via.

4. The method of claim 1, wherein computing the transformed feature vector comprises:
    computing a feature vector; and
    applying a linear transformation to transform the feature vector to a transformed feature vector.

5. The method of claim 1, wherein computing the pairwise distances comprises computing dot products between pairs of the transformed feature vectors.

6. The method of claim 1, wherein determining the proximity metric comprises determining a pairwise distance at a percentile level in a distribution of the pairwise distances.

7. The method of claim 1, wherein the proximity threshold is determined from a distribution of proximity metrics, and wherein each proximity metric in said distribution corresponds to a transformed feature vector in the training set.

8. The method of claim 1, wherein the defects are unclassified upon detection.

9. The method of claim 1, wherein the multiple subcomponents are inspected in real-time as part of a manufacturing process.

10. A product manufactured using a process that involves a method for simultaneous inspection of multiple subcomponents of a component for defects, the method comprising, inspecting the multiple subcomponents with an x-ray inspection device, with the inspecting the multiple subcomponents performed in parallel in real-time for each subcomponent undergoing defect detection:

extracting a subcomponent image from image data of the component;
 computing a transformed feature vector from the subcomponent image;
 computing pairwise distances from the transformed feature vector to each transformed feature vector in a training set;
 determining a proximity metric using said pairwise distances;
 comparing the proximity metric against a proximity threshold to detect a defect in the subcomponent;
 the transformed feature vector corresponds to a characteristic feature of submicron size; and
 the process simultaneously evaluates the multiple subcomponents during parallel procedural steps.

11. The product of claim 10, wherein the component comprises a semiconductor package.

12. The product of claim 11, wherein the subcomponent comprises a through-silicon via.

13. The product of claim 10, wherein computing the transformed feature vector comprises:
 computing a feature vector; and
 applying a linear transformation to transform the feature vector to a transformed feature vector.

14. The product of claim 10, wherein computing the pairwise distances comprises computing dot products between pairs of the transformed feature vectors.

15. The product of claim 10, wherein determining the proximity metric comprises determining a pairwise distance at a percentile level in a distribution of the pairwise distances.

16. The product of claim 10, wherein the proximity threshold is determined from a distribution of proximity metrics, and wherein each proximity metric in said distribution corresponds to a transformed feature vector in the training set.

17. The product of claim 10, wherein the defects are unclassified upon detection.

18. The product of claim 10, wherein the multiple subcomponents are inspected in real-time as part of a manufacturing process.

19. A system for inspecting a subcomponent of a semiconductor component for defects, the system comprising:
 an x-ray imaging apparatus for obtaining image data of the subcomponent of the semiconductor component;
 at least one processor for executing computer-readable code; and
 memory for storing and accessing computer-readable code and data;
 computer-readable code for extracting a subcomponent image from the image data of the component;
 computer-readable code for computing a transformed feature vector from the subcomponent image;
 computer-readable code for computing pairwise distances from the transformed feature vector to each transformed feature vector in a training set;
 computer-readable code for determining a proximity metric using said pairwise distances;
 computer-readable code for comparing the proximity metric against a proximity threshold to detect a defect in the subcomponent;
 the transformed feature vector corresponds to a characteristic feature of submicron size;
 the subcomponent is one of multiple subcomponents; and
 the system simultaneously evaluates the multiple subcomponents during parallel procedural steps.

\* \* \* \* \*